(12) United States Patent
Uemura et al.

(10) Patent No.: US 11,412,110 B2
(45) Date of Patent: Aug. 9, 2022

(54) CAMERA MODULE

(71) Applicant: KYOCERA Corporation, Kyoto (JP)

(72) Inventors: Hiroki Uemura, Miyakonojo (JP); Yukinori Fukunaga, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 82 days.

(21) Appl. No.: 16/980,285

(22) PCT Filed: Mar. 18, 2019

(86) PCT No.: PCT/JP2019/011077
§ 371 (c)(1),
(2) Date: Sep. 11, 2020

(87) PCT Pub. No.: WO2019/181825
PCT Pub. Date: Sep. 26, 2019

(65) Prior Publication Data
US 2021/0014391 A1    Jan. 14, 2021

(30) Foreign Application Priority Data
Mar. 22, 2018  (JP) .............................. JP2018-054043

(51) Int. Cl.
*H04N 5/225*     (2006.01)
*H05K 1/18*      (2006.01)

(52) U.S. Cl.
CPC ......... *H04N 5/2252* (2013.01); *H04N 5/2253* (2013.01); *H04N 5/2254* (2013.01); *H05K 1/189* (2013.01); *H05K 2201/05* (2013.01)

(58) Field of Classification Search
CPC .................. G03B 17/02; H01L 27/14618; H04N 5/2252; H04N 5/2253; H04N 5/2254;
(Continued)

(56) References Cited

U.S. PATENT DOCUMENTS

| 2001/0055073 | A1  | 12/2001 | Shinomiya |
| 2003/0039060 | A1* | 2/2003  | Komatsu ............. G11B 33/02 360/99.04 |

(Continued)

FOREIGN PATENT DOCUMENTS

| JP | 2002-077683 A | 3/2002 |
| JP | 2002-330319 A | 11/2002 |

(Continued)

*Primary Examiner* — Amy R Hsu
(74) *Attorney, Agent, or Firm* — Procopio Cory Hargreaves and Savitch LLP

(57) ABSTRACT

A camera module includes a housing, a lens, an assembly, a terminal, and an electronic component. The housing includes a front surface part, a rear surface part on the opposite side to that, and a side surface part connecting the front surface part and the rear surface part. The lens is exposed from the front surface part. The assembly includes an image sensor and is located on the rear surface part side relative to the lens. The terminal is located at the rear surface part for connection with an outside part. A flexible board includes a part extending from the assembly toward the terminal. The electronic component is mounted on the flexible board.

11 Claims, 9 Drawing Sheets

(58) Field of Classification Search
CPC ...... H04N 5/2257; H05K 1/028; H05K 1/113; H05K 1/147; H05K 1/181; H05K 1/189; H05K 2201/05; H05K 2201/052; H05K 2201/10121; H05K 2201/10151; H05K 2201/10303; H05K 3/0064
See application file for complete search history.

(56) References Cited

U.S. PATENT DOCUMENTS

| | | |
|---|---|---|
| 2006/0004257 A1 | 1/2006 | Gilad et al. |
| 2010/0060601 A1* | 3/2010 | Oohira .............. G02F 1/133308 345/173 |
| 2011/0199473 A1 | 8/2011 | Kojima |
| 2011/0279675 A1 | 11/2011 | Mano et al. |
| 2012/0169918 A1* | 7/2012 | Hasegawa ............ H04N 5/2252 348/E5.025 |
| 2013/0083505 A1* | 4/2013 | Kobayashi ........... H05K 1/0245 174/250 |
| 2018/0004030 A1* | 1/2018 | Yamaguchi .......... H05K 1/0269 |
| 2018/0183169 A1* | 6/2018 | Yamanaka ......... H01R 13/5202 |

FOREIGN PATENT DOCUMENTS

| | | |
|---|---|---|
| JP | 2011-166012 A | 8/2011 |
| JP | 2013-183425 A | 9/2013 |

* cited by examiner

CAMERA MODULE

TECHNICAL FIELD

The present disclosure relates to a camera module.

BACKGROUND ART

There is known a camera module utilized as an element of a system such as a vehicle-mounted camera module (for example Patent Literature 1). The camera module in Patent Literature 1 has a housing, a lens exposed at the front surface of the housing, and a terminal for external connection use which is exposed at a rear surface of the housing. At the inside part of the housing, in order from the lens side to the terminal side, an image sensor, a rigid type first circuit board on which the image sensor is mounted, a rigid type second circuit board connected to the first circuit board, and a flexible board connecting the second circuit board and the terminal are provided. On the second circuit board, a circuit chip (electronic component) is mounted. The flexible board has a signal line pattern part connecting the second board and the terminal and a GND line pattern part which is branched from the signal line pattern part. The GND pattern part is connected to a shield case in the housing.

CITATION LIST

Patent Literature

Patent Literature 1: Japanese Patent Publication No. 2011-166012

SUMMARY OF INVENTION

A camera module according to one aspect of the present disclosure includes a housing, a lens, an assembly, a terminal, a flexible board, and an electronic component. The housing includes a front surface part, a rear surface part on the opposite side to that, and a side surface part connecting the front surface part and the rear surface part. The lens is exposed from the front surface part. The assembly includes an image sensor and is located on the rear surface part side relative to the lens. The terminal is located at the rear surface part for connection with an outside part. The flexible board includes a part extending from the assembly toward the terminal. The electronic component is mounted on the flexible board.

A camera module according to one aspect of the present disclosure includes a housing, a lens, an assembly, a terminal, a connection member, and an electronic component. The housing includes a front surface part, a rear surface part on the side opposite to that, and a side surface part connecting the front surface part and the rear surface part. The lens is exposed from the front surface part. The assembly includes an image sensor and is located on the rear surface part side relative to the lens. The terminal is located at the rear surface part for connection with an outside part. The connection member is a flexible one extending from the assembly toward the terminal. The electronic component is electrically connected to the assembly and the terminal and is located separated from the assembly toward the rear surface part side in the housing.

DESCRIPTION OF EMBODIMENTS

Figure 1:
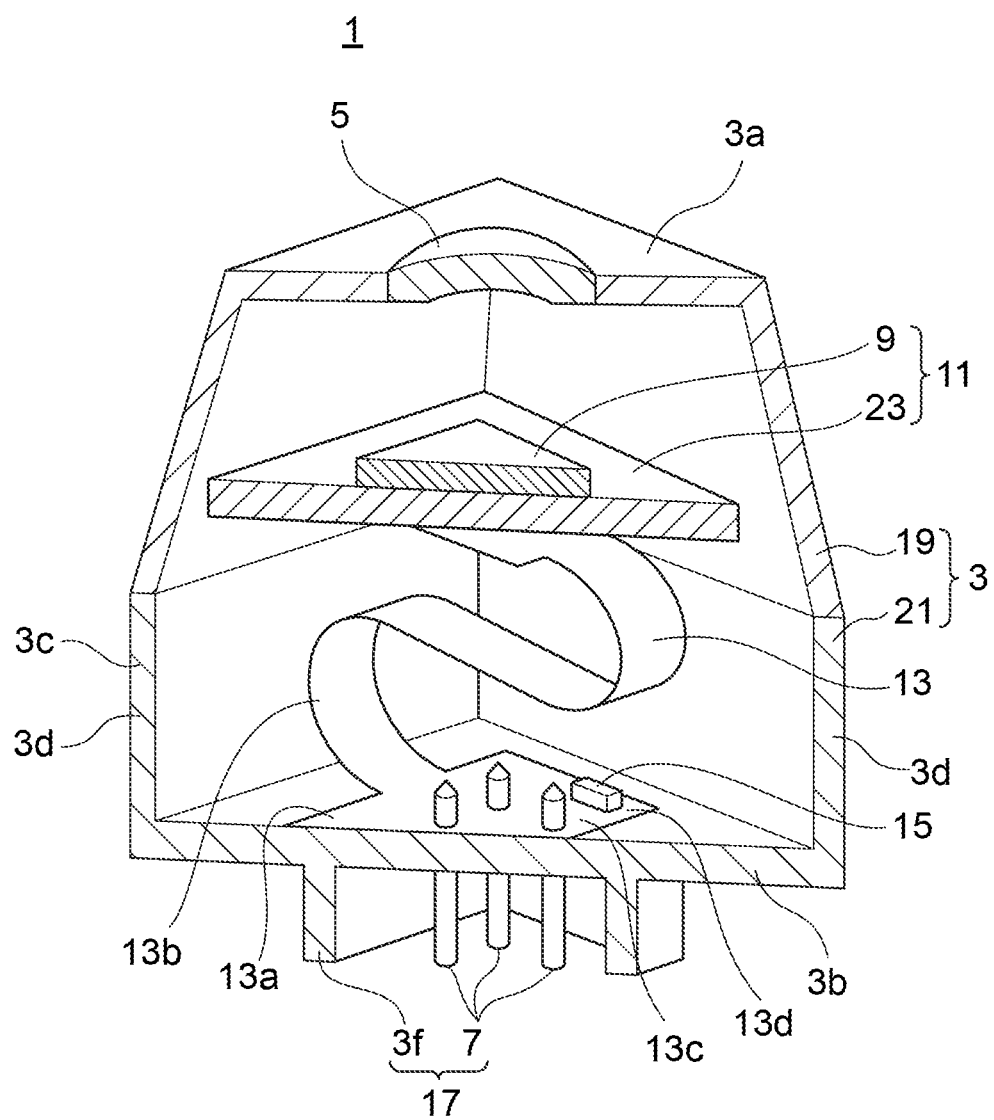
FIG. 1 is a schematic perspective view showing cutaway a camera module according to a first embodiment.

Below, embodiments of the present disclosure will be explained with reference to the drawings. Note that, the drawings used in the following explanation are schematic ones. Accordingly, for example, sometimes details will be omitted. Further, size ratios etc. in the drawings do not always coincide with the actual ones.

In the second and following embodiments, configurations common with or resembling already explained configurations use notations attached to the already explained configurations or sometimes illustration and explanation will be omitted. Note that, the configurations corresponding to (resembling) the already explained configurations may be made the same as the already explained configurations for points which are not particularly explained even in a case where notations different from those for the already explained configurations are attached.

First Embodiment

FIG. 1 is a schematic perspective view showing cutaway a camera module 1 according to a first embodiment 1.

The camera module 1 is for example one for mounting on a vehicle and is utilized for drive assistance and/or drive recording and the like. For example, the camera module 1 is made a size with vertical, horizontal, and height dimensions of 1 cm to 5 cm and is provided inside or outside the car body in an orientation capturing images at the front, rear, or lateral sides of the car body. The camera module 1 is electrically connected to a not shown ECU (electronic control unit or engine control unit) and is controlled by the ECU. Further, the signal output from the camera module 1 is processed by the ECU.

Note that, the applications of the camera module 1 are not limited to vehicle mounting use. The dimensions thereof may also be smaller or larger than the dimensions exemplified above. However, below, sometimes the explanation will be given by reference to the example of case where the camera module 1 is one for mounting on a vehicle.

(Overall Configuration of Camera Module)

The camera module 1 for example has a housing 3, a lens 5 exposed from the housing 3, and a plurality of terminals 7 for external connection use positioned on the side opposite to the lens 5 in the housing 3. As will be understood from the position of the lens 5, in the camera module 1, the upper part side on the drawing sheet is made the imaging side. Further, the vertical direction on the drawing sheet is a direction of an optical axis. The plurality of terminals 7 are connected through a not shown cable to the ECU when the camera module 1 is one for mounting in a vehicle.

Further, the camera module 1, in the inside part of the housing 3, has an assembly 11 including an image sensor 9, a flexible board 13 which extends from the assembly 11 toward the plurality of terminals 7, and an electronic component 15 mounted on the flexible board 13. By these, for example, an image formed on the image sensor 9 by the lens 5 is converted to an electrical signal which is output from any of the plurality of terminals 7. Although not particularly shown, the camera module 1 may have for example a shield case other than the parts described above.

The signal output from the camera module 1 is for example a signal including information (image data) for reproducing the captured image. The camera module 1, for example, outputs a plurality of image data (a plurality of frames of image data) obtained along with the elapse of time in order and thereby contribute to provision of the information of a moving picture image. Note that, the camera module 1 may be one used for the purpose of acquiring a still image according to need. Further, the camera module 1 may output information of some sort of result of judgment based on the image data in addition to or in place of the signal of the image data.

(Housing)

The housing 3 includes for example a part holding the lens 5 (front surface part 3a, lens barrel), a part accommodating the assembly 11 etc., and a part configuring a connector 17 (connector housing part 3f). Note that, in this way, in the explanation of the present embodiment, the term "housing" designates not only a pure box-shaped part, but also a relatively wide part. The inside part of the housing 3 is for example basically sealed.

The outer shape of the housing 3 may be made a suitable one. In the example shown, the outer shape of the housing 3 is substantially the shape of a combination of a right prism having a square bottom surface (terminal 7 side) and a frustum having a square bottom surface (lens 5 side). From another viewpoint, the housing 3, when viewed in the direction of the optical axis, has a substantially rectangular outer shape. FIG. 1 becomes a schematic perspective view cut along one diagonal line of that rectangle. Further, the connector housing part 3f is formed in a cylindrical shape projecting so as to surround the plurality of terminals 7. The "cylinder" referred to here may be circular or rectangular when viewed in the connection direction (here, the same direction as the direction of the optical axis).

Naturally, the outer shape of the housing 3 is not limited to the above shape. For example, the schematic shape of the outer shape of the housing 3 may rectangular cuboid shape, may be a shape of a combination of a rectangular cuboid shape (terminal 7 side) and a right circular cylinder (lens 5 side) projecting from the rectangular cuboid shape, may be a right prism having a polygonal shape other than a square (for example a pentagon) as the bottom surface, may be a combination of such a right prism (terminal 7 side) and a right circular cylinder (lens 5 side) projecting from the right prism, may be a right circular cylinder, or may be a shape having a higher design sense. Each right circular cylinder mentioned above may be a part formed as a lens barrel holding the lens 5. Note that, below, as in the example shown, sometimes the explanation will be given with reference to the example of a case where the outer shape of the housing 3 includes a part of a rectangular cuboid shape or a right prism shape on the terminal 7 side.

The shape of the internal spade of the housing 3 (shape of the inner surface) may also be a suitable shape. In the example shown, the shape of the internal space of the housing 3 becomes substantially a similar shape to the outer shape of the housing 3 explained above. Accordingly, the housing 3 has substantially a rectangular cuboid space on at least the terminal 7 side. From another viewpoint, the housing 3, on the terminal 7 side, has a flat inner surface (inner surface of the rear surface part 3b) perpendicular to the optical axis and a flat wall surface (inner surface of the side surface part 3d) surrounding the four sides of the former surface.

Naturally, the shape of the internal space of the housing 3 is not limited to the above shape. For example, it may be a shape that includes a polygonal prism other than a quadratic prism or may be a right circular cylinder on the terminal 7 side as well. However, in the following explanation, sometimes the explanation will be given with reference to the example of a case where a substantially rectangular cuboid-shaped space is formed on the terminal 7 side.

When considered dividing the housing 3 into a plurality of portions, for example, the housing 3 has a front surface part 3a facing an image capturing side (front side of the lens 5), a rear surface part 3b on the opposite side to that, and an outer circumferential surface part 3c (side surface part 3d) joining the front surface part 3a and the rear surface part 3b. The outer circumferential surface part 3c is a part which joins the front surface part 3a and the rear surface part 3b over their entire circumferences. In the outer circumferential surface part 3c, the parts forming the sides of a polygon when viewed in the direction of the optical axis will be referred to as "side surface parts 3d". In the example shown, the outer circumferential surface part 3c has four side surface parts 3d since the outer shape of the housing 3 includes the right prism-shaped part on at least the terminal 7 side.

As will be understood from the above explanation of the outer shape of the housing 3, the shapes of the outer surfaces of these parts (3a to 3d) may be made suitable shapes. In the example shown, the outer surface of the front surface part 3a configures the upper bottom of a frustum. The outer surface of the rear surface part 3b configures the bottom surface of a right prism (terminal 7 side). The outer surface of the outer circumferential surface part 3c (side surface part 3d) configures the side surface of the frustum and side surfaces of the right prism.

Note that, boundaries of the parts (3a to 3d) may be suitably defined in accordance with the outer shape of the housing 3. For example, unlike the example shown, when the outer shape of the housing 3 is a shape of a combination of a rectangular cuboid (terminal 7 side) and a right circular cylinder (lens 5 side) projecting from the rectangular cuboid, the front surface part 3a may be defined as the part configuring the bottom surface on the lens 5 side in the right circular cylinder or may be defined as the part configuring the entire right circular cylinder and the plane on the right circular cylinder side in the rectangular cuboid.

The shapes of the parts (3a to 3d) may be suitably set so that the shapes of the outer surface and inner surface of the housing 3 explained above are realized. In the example shown, each of the front surface part 3a, rear surface part 3b, and outer circumferential surface part 3c is substantially formed in a plate shape with a substantially constant thickness which has the direction in which its outer surface faces as the thickness direction. Note that, the plate shape referred to here includes not only a flat plate shape (example shown), but also a curved plate shape (for example a plate shape that configures a circular cylinder).

Naturally, the shape of each part (3a to 3d) is not limited to a plate shape having the direction in which its outer surface faces as the thickness direction as described above. For example, the housing 3 may include a cylindrical part around the optical axis (lens barrel holding the lens 5) and the front surface part 3a may be the front end part of that cylindrical part (edge part of the cylinder).

The housing 3 is for example formed by a plurality of members in combination. The divided positions of the housing 3 (positions of boundaries among the plurality of members) and the number of the plurality of members etc. may be suitably set. For example, the housing 3 has a front side housing 19 on the lens 5 side and a rear side housing 21 on the opposite side to that.

The front side housing 19 is a member with a box shape opened on the side opposite to the lens 5 (the box is not limited to a rectangular cuboid shape, same is true for the following explanation). The rear side housing 21 is the box-shaped member opened on the lens 5 side. Further, the opening sides of the two are connected to each other to thereby configure the housing 3. The two may be connected according to known various methods such as engagement, screwing, bonding, or the like. Further, one opening side edge part may be fit at the inner side of the other opening side edge part as well.

Although not particularly shown, each of the front side housing 19 and the rear side housing 21 may be configured by further more members. For example, the front side housing 19 may be configured by a lens barrel holding the lens 5 and a member configuring at least the lens 5 side part in the outer circumferential surface part 3c fixed to each other. They may be fixed indirectly through another member in the housing 3 as well. Further, for example, the rear side housing 21 may be configured by a member configuring a part other than a connector housing part 3f in the rear side housing 21 and a member configuring the connector housing part 3f fixed to each other as well.

The material of the housing 3 is for example basically made an insulating material. The insulating material is for example a resin. Note that, use may be made of a ceramic or other insulating material as well. Further, in the housing 3, a conductor (metal) may be used in part or the entirety as well. For example, the housing 3 may be one formed by burying a metal (shield case) in a resin or may be one which is basically made of a resin and has a conductive paint coated at a suitable position on the inner surface.

(Lens)

The lens 5 may be a single lens made of a uni-lens or may be a lens group (optical system) formed by a plurality of lenses. The lens 5 is arranged in the opening formed in the front surface part 3a and is exposed to the outside part of the housing 3. Further, the lens 5 focuses the light from the outside part of the housing 3 and forms an image in the inside part of the housing 3 (on the image sensor 9). Note that, when referring to the fact that the lens 5 is exposed from the front surface part 3a, this means that the lens 5 can be seen from the front surface part 3a side and need not always contact the outside air. Accordingly, for example, the lens 5 may be covered by a transparent cover configuring a part of the housing 3 as well. Note that, it is also possible to grasp the transparent cover as a part of the lens 5.

(Terminals)

The terminal 7 is for example configured by a pin-shaped metal. Each terminal 7 is for example inserted into a hole formed in the rear surface part 3b and is fixed with respect to the rear surface part 3b by solder or another bonding material. Further, the plurality of terminals 7 are for example inserted into holes formed in a flexible board 13 and are bonded with respect to the wirings (conductive pattern) of the flexible board 13 by solder or another conductive bonding material.

Note that, the bonding material bonding the terminals 7 to the rear surface part 3b and the bonding material bonding the terminals 7 to the flexible board 13 may be materials which are different from each other or may be materials which are the same as each other. In the latter case, the two may be separately supplied and cured or may be simultaneously supplied and cured.

The number and arrangement of the terminals 7 may be suitably set. In the example shown, six terminals 7 are arranged on the center side of the rear surface part 3b (a half of them is shown). Further, the six terminals 7 are arranged in two lines along the side of the rear surface part 3b.

The plurality of terminals 7 and connector housing part 3f configure the connector 17. This connector 17 is for example connected with the not shown other side connector which fits in the connector housing part 3f. The other side connector has hole parts in which the pin-shaped terminals 7 fit. The inner surfaces of the hole parts are provided with terminals abutting against the terminals 7.

Note that, the male type and the female type may be inverse to the above as well. That is, the terminals 7 may be ones which are formed on the inner surfaces of the holes into which the pins are inserted as well. In this case, the terminals 7 may be for example metal members having suitable shapes abutting against the outer circumferential surfaces of the pins. The shape of the metal members may be for example flat plate shapes, may be cylindrical shapes into which the pins are inserted, or may be shapes including plate spring parts.

(Assembly)

The assembly 11 for example has the already mentioned image sensor 9 and a rigid board 23 on which the image sensor 9 is mounted.

The image sensor 9 is for example configured by a CMOS (complementary metal oxide semiconductor) or CCD (charge coupled device) or another solid state image sensor. Although not particularly shown, the image sensor 9 has a plurality of pixels which are vertically and horizontally arranged on a light receiving surface on the lens 5 side. Each pixel is configured including a photoelectric conversion element, converts light incident upon each pixel to an electrical signal having a signal strength in accordance with the amount of the light, and outputs the result. Due to this, image data (raw data) of an image formed on the light receiving surface of the image sensor 9 by the lens 5 is generated.

Further, although not particularly shown, the image sensor 9 for example has a bare chip, a package sealing the bare chip, and a plurality of leads extending to the outer side and lower side of the package. Further, by bonding the leads to pad-shaped lands on the rigid board 23 by solder or the like, the image sensor 9 is surface-mounted on the rigid board 23. Note that, the image sensor 9 may be a type mounted by a method other than that described above or may be a bare chip. Further, the image sensor 9 for example may have a color filter and/or lens array etc.

The rigid board 23 contributes to for example fixation (positioning) of the image sensor 9 with respect to the housing 3 (lens 5), mounting of not shown electronic components, and the like. The image sensor 9 is for example electrically connected through the rigid board 23 with the other electronic components and/or flexible board 13 which are connected to the rigid board 23.

The rigid board 23 is for example a rigid type printed circuit board. The rigid board 23 is for example a double-sided board comprised of a board shaped insulator on the two sides of which conductor layers are formed or a multilayer board comprised of a board shaped insulator on and in which three or more conductor layers are formed. Note that, it is also possible to form the rigid board 23 by single-sided board comprised of a board shaped insulator on only one surface of which a conductor layer is formed.

The planar shape of the rigid board 23, the material of the insulator, the material of the conductor layers, and the conductor patterns included in the conductor layers etc. may be suitable ones. For example, the insulator may be one formed by a glass fabric or other base material in which a resin is impregnated or may be a ceramic. The conductor layer may form lands for mounting the electronic components and wirings connecting the lands to each other plus inductors or capacitors or other parts. The rigid board 23 may have an insulation film (solder resist) covering the conductor layer for reducing unwanted short-circuiting of the conductor layer.

The rigid board 23 (image sensor 9) is arranged facing the lens 5. The rigid board 23 is for example arranged so that the light receiving surface of the image sensor 9 is substantially positioned at a rear side focal point of the lens 5. When the rigid board 23 is arranged with respect to the housing 3 in this way, the size of the space on the side closer to the terminals 7 than the rigid board 23 in the housing 3 may be suitably set. For example, the distance from the rigid board 23 to the inner surface of the rear surface part 3b (height of the space on the terminal 7 side) may be made longer than the distance from the lens 5 to the image sensor 9.

The rigid board 23 may be suitably fixed with respect to the housing 3. For example, although not particularly shown, the housing 3 has a plurality of rods which extend from the front surface part 3a toward the terminal 7 side. On the other hand, the rigid board 23 has a plurality of holes into which the rods are inserted. Further, after the image sensor 9 and other electronic component are mounted, the rigid board 23 is fixed with respect to the housing 3 by insertion of the rods into the plurality of holes and bonding to the rods by solder or another bonding material. Other than this, for example, the surface on the lens 5 side in the rigid board 23 may be bonded to the end surface on the terminal 7 side in a member including a lens barrel holding the lens 5 as well.

As will be understood from the above description, the rigid board 23 may be fixed with respect to the member holding the lens 5 in the housing 3 in a manner by which it is impossible to change the position relationships between the lens 5 and the image sensor 9 without breaking the bonding material etc. Note that, at the time of fixing the board, the image captured by the image sensor 9 through the lens 5 may be confirmed while positioning the lens 5 and the image sensor 9.

Various electronic components other than the image sensor 9 may be mounted on the rigid board 23. For example, ICs (integrated circuits), diodes, transistors, resistors, inductors, and/or capacitors may be mounted on the rigid board 23. The electronic components may be active elements or may be passive elements. The IC may be an ISP (image signal processor) processing raw data from the image sensor 9 as well.

Further, although not particularly shown, a connector for connecting the flexible board 13 to the rigid board 23 may be mounted on the rigid board 23 as well. The connector is for example mounted on the surface on the terminal 7 side of the rigid board 23. The configuration of the connector may be suitable one. For example, the connector may be one configuring a combination of male type and female type connectors together with a connector mounted on the flexible board 13. Further, for example, the connector may be one having a plurality of terminals on the inner wall surface of a slit and with part of the flexible board 13 inserted in the slit. Note that, the rigid board 23 and the flexible board 13 can be connected by solder or the like without using a connector. Further, they can be connected on the lens 5 side in the rigid board 23.

(Flexible Board)

The flexible board 13 contributes to connection of the rigid board 23 (image sensor 9) and the plurality of terminals 7. Further, the flexible board 13 provides a region for mounting the electronic component 15 and in turn contributes to connection of the electronic component 15 and the other parts (23, 9, and/or 7 etc.)

The flexible board 13 is for example a printed circuit board having flexibility (that is, FPC: flexible printed circuit). The flexible board 13 may be one comprised of an insulating film on the two surfaces on which having conductor layers, may be one comprised of an insulating layer on only one surface of which having a conductor layer, or may be one comprised of the formers stacked together and having three or more conductor layers. The flexible board 13 may have an insulation film (solder resist) covering the conductor layer for reducing unwanted short-circuiting of the conductor layer. The inductors or capacitors or other parts may be configured by the conductor layer of the flexible board 13 as well. The flexible board 13 may be one having flexibility equally over its entirety or may be one having flexibility made relatively higher in the part where bending is planned.

The flexible board 13 for example has a terminal connection part 13a connected to the plurality of terminals 7 and a relay part 13b extending from the terminal connection part 13a up to the assembly 11.

The terminal connection part 13a for example faces the inner surface of the rear surface part 3b in the housing 3. Accordingly, from another viewpoint, the flexible board 13 has a rear surface facing part 13c which faces the inner surface of the rear surface part 3b. Note that, when referring to "face", the mutually facing two surfaces need not be parallel. For example, the surfaces may be inclined relative to each other or at least one surface may bend. Further, in the present embodiment, the terminal connection part 13a and the rear surface facing part 13c may be grasped as the same ones or may be grasped so that one includes the other. In the explanation in the present embodiment, between the two, mainly the term "terminal connection part 13a" will be used. However, this term may be replaced by the rear surface facing part 13c.

The terminal connection part 13a has a size large enough to extend over the range where the plurality of terminals 7 are arranged. The plurality of terminals 7 are inserted into the terminal connection part 13a as already explained. The terminal connection part 13a may be suitably set in the planar shape, the size for the range where the plurality of terminals 7 are arranged, and the size relative to the inner surface of the rear surface part 3b. In the example shown, the terminal connection part 13a is given substantially a rectangular shape smaller than the inner surface of the rear surface part 3b. From another viewpoint, the terminal connection part 13a is shaped so as to have outer edges extending along the outer edges of the rear surface part 3b (for example substantially similar shape). Note that, the terminal connection part 13a may have a size equal to the inner surface of the rear surface part 3b as well.

The terminal connection part 13a may be bonded by an adhesive or the like (bonding layer) to the inner surface of the rear surface part 3b or need not be so bonded. However, when the terminals 7 are bonded with respect to the terminal connection part 13a and rear surface part 3b as in the above explanation, the terminal connection part 13a is at least fixed with respect to the rear surface part 3b directly or indirectly through the terminals 7 at the positions of the terminals 7.

The terminal connection part 13a may be superposed on the inner surface of the rear surface part 3b directly or indirectly through a suitable material (may be directly or indirectly in close contact with the inner surface) or may be separated from the inner surface of the rear surface part 3b through a clearance. As the material interposed between the terminal connection part 13a and the rear surface part 3b as described above, for example, an adhesive or grease can be mentioned.

When the terminal connection part 13a is directly or indirectly in close contact with the inner surface of the rear surface part 3b, compared with a case where there is a clearance (air) between the two, the heat dissipation property from the terminal connection part 13a to the housing 3 is improved. The region where the terminal connection part 13a is in close contact with the inner surface of the rear surface part 3b is for example 80% or more or the entirety of the area of the terminal connection part 13a. As will be explained later, the electronic component 15 is mounted on the terminal connection part 13a. The close contact region includes for example a region where the electronic component 15 is mounted.

Note that, when at least a part of the terminal connection part 13a is directly or indirectly in close contact with the inner surface of the rear surface part 3b without an adhesive interposed, spacing of the terminal connection part 13a from the rear surface part 13b may be suitably suppressed. For example, bonding of the terminals 7 and the terminal connection part 13a may contribute to the above adhesion. Further, for example, a not shown member pushing the terminal connection part 13a against the rear surface part 3b may be provided as well. Further, for example, the relay part 13b is folded as will be explained later. Therefore, when the relay part 13b generates a restoring force returning it to the flat state, this restoring force may be utilized as well.

The relay part 13b extends out of a part of the outer edge of the terminal connection part 13a. The connection position of the relay part 13b with respect to the terminal connection part 13a and the shape, size, etc. of the relay part 13b may be suitably set. In the example shown, the relay part 13b extends out of the center side part of one side of the rectangular terminal connection part 13a with a width shorter than the length of the one side. Note that, the relay part 13b may have an equal width to the length of the one side as well.

Further, in the example shown, when the flexible board 13 is laid out to a flat state, the relay part 13b is substantially formed in a long shape so as to linearly extend with a constant width. Further, the relay part 13b is accommodated in the housing 3 in a state where it is folded back and forth a suitable number of times. In the example shown, the relay part 13b is folded two times (substantially formed in an S-shape).

Note that, the number of times of folds of the relay part 13b may be one or may be three or more. Further, the space in which the relay part 13b is accommodated is more specifically the space between the assembly 11 (rigid board 23) and the rear surface part 3b (terminal connection part 13a). This space is secured relatively large as explained in the explanation of the position where the rigid board 23 is arranged.

The end part of the relay part 13b on the rigid board 23 side is connected to the rigid board 23 as already explained. There may be various methods of connection as already explained. Note that, in the example shown, the relay part 13b is made broader in width in the end part on the rigid board 23 side. Due to this, for example, the majority (for example 60% or more of the length) of the relay part 13b is made relatively thin, while an area required for mounting the connector etc. can be secured on the rigid board 23 side. Naturally, the relay part 13b may be constant in the width over its entirety as well.

(Electronic Component)

The electronic component 15 is for example an IC, diode, transistor, resistor, inductor, or capacitor. As will be understood from the above illustration, the electronic component 15 may be an active element or may be a passive element.

The electronic component 15 is for example mounted on the terminal connection part 13a of the flexible board 13. More specifically, in the terminal connection part 13a, the electronic component 15 is mounted in the region outside the range where the plurality of terminals 7 are arranged. Further, between the two surfaces of the terminal connection part 13a, the electronic component 15 is mounted on the surface on the side opposite to the rear surface part 3b. With respect to the plurality of terminals 7, the electronic component 15 may be positioned on the relay part 13b side, may be positioned on the side opposite to the relay part 13b, or may be positioned on a lateral side of a direction toward the relay part 13b (example shown).

Note that, it is also possible to view the flexible board 13 as having a terminal connection part 13a, a relay part 13b extending out of part of the edge part of the terminal connection part 13a, and an extending part 13d which extends out of another part of the edge part of the terminal connection part 13a and the electronic component 15 as being mounted on the extending part 13d. However, in the present embodiment, basically the explanation will be given while viewing the electronic component 15 as being mounted on the terminal connection part 13a. As will be understood from the shape of the extending part 13d, when referring to part of the flexible board 13 extending out (or extends), the part need not have a shape longer in the extending direction. The width may be larger than the length in the extending direction as well.

In the example shown, one electronic component 15 is mounted. However, the number of electronic component 15 is not limited to one. Two or more electronic components 15 may be mounted on the terminal connection part 13a as well. Also in the embodiments which will be explained later, basically, the minimum number of electronic parts 15 required for the explanation will be shown. However, a greater number (or smaller number) of electronic components 15 than the number shown may be provided.

The electronic component 15 is for example a surface-mounted type. Although not shown here, it is mounted to the flexible board 13 by bonding a plurality of pads or a plurality of leads with respect to pad-shaped lands provided on one major surface of the flexible board 13 by solder or another bonding material. Note that, it is also possible to form the electronic component 15 as an insert and mount type by inserting a lead into the flexible board 13.

When the relay part 13b of the flexible board 13 is bent in an S-shape as in the example shown, the surface of the relay part 13b facing the rigid board 23 and the surface of the terminal connection part 13a in the flexible board 13 which faces the inside part side of the housing 3 (surface on the side opposite to the rear surface part 3b) become the same surface of the flexible board 13. Accordingly, when the flexible board 13 is connected to the rigid board 23 by a not shown connector which is surface-mounted on the flexible board 13, the connector and the electronic component 15 may be mounted on the same major surface of the flexible board 13 and in turn the flexible board 13 may be made a single-sided substrate.

(Functional Blocks)

Figure 2:
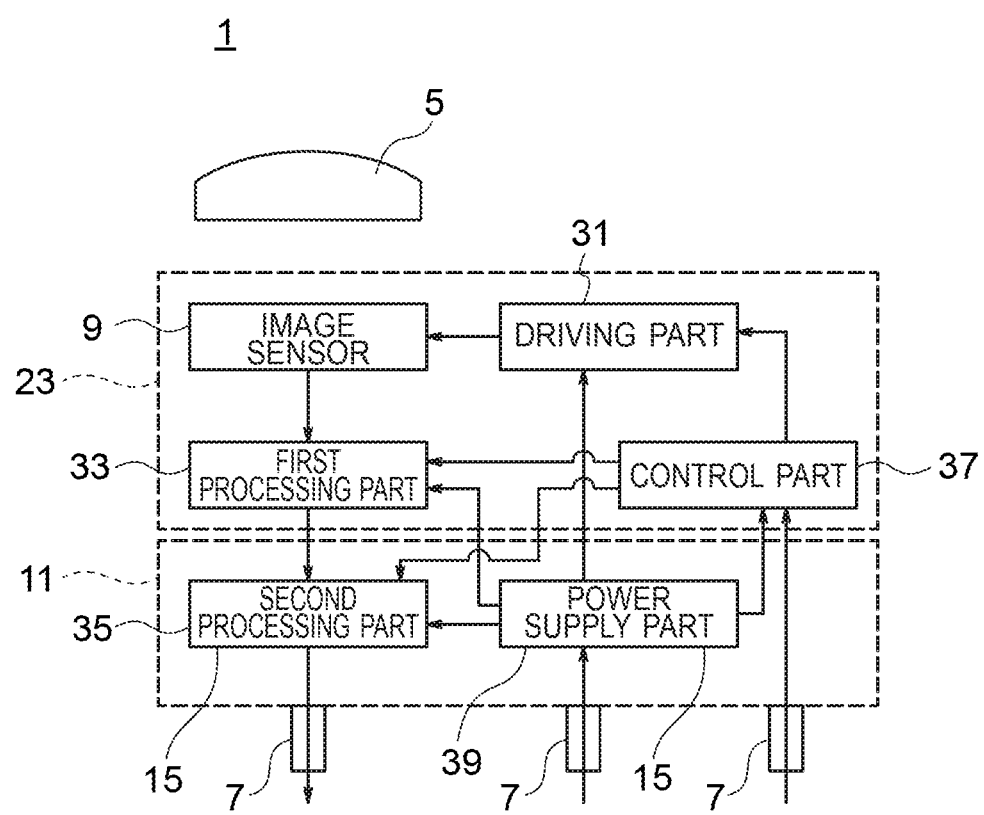
FIG. 2 is a block diagram showing the configuration of a signal processing system in a camera module in FIG. 1.

FIG. 2 is a block diagram showing the configuration of a signal processing system in the camera module 1.

The camera module 1 has the lens 5 and image sensor 9 as already explained. Further, the camera module 1 has for example a driving part 31 driving the image sensor 9, a first processing part 33 processing the signal output by the image sensor 9, a second processing part 35 processing the signal output by the first processing part 33, a control part 37 integrally controlling them, and a power supply part 39 supplying power to the parts (31, 33, 35, and 37).

The driving part 31 for example generates a pulse signal for initialization and a pulse signal (driving signal) having a predetermined frequency for signal transfer in the image sensor 9 and inputs the results to the image sensor 9. Receiving the driving signal, the image sensor 9 outputs a signal in accordance with the captured image (signal of image data). The driving part 31 for example outputs a pulse signal to the image sensor 9 so that the signal of the image data is continuously (repeatedly) output. Due to this, data of a moving picture image is obtained from the image sensor 9.

The first processing part 33 and second processing part 35, for example, as a whole, perform the predetermined processing on the signal from the image sensor 9 and outputs the processed signal to the terminals 7. The processing carried out by these processing parts on the signal from the image sensor 9 is for example amplification, A/D conversion, filtering, AE (automatic exposure), AWB (auto white balance), serial conversion, adding a header or other suitable information, and/or D/A conversion. Note that, the header includes for example information specifying the order of images in a plurality of frames.

The first processing part 33 and second processing part 35 perform the processing as described above suitably divided. For example, the first processing part 33 performs processing on the signal of raw data from the image sensor 9. On the other hand, the second processing part 35 performs processing on the signal after processing by the first processing part 33 and outputs the processed signal to the terminals 7. Up to which processing the first processing part 33 performs can be suitably set. Note that, the first processing part 33 and the second processing part 35 can also perform the same processing divided between them.

The form of the signal which is output from the second processing part 35 to the terminals 7 may be made a suitable one. For example, the signal may be an LVDS (low voltage differential signaling) signal. In this case, the second processing part 35 for example may be configured including an electronic component converting a signal including information to be output to an LVDS signal as well. Note that, the signal which is output from the second processing part 35 to the terminals 7 is not limited to LVDS. For example, it may be a single end signal as well.

The control part 37, for example, controls the start of driving and stopping of driving of the driving part 31, first processing part 33, and second processing part 35 in accordance with the control signal input form the terminals 7. Further, for example, the control part 37 supplies a clock pulse to these parts (31, 33, and 35) and performs processing for synchronizing them. Note that, the division of the roles of the driving part 31, first processing part 33, second processing part 35, and control part 37 may be suitably set.

Note that, the types of the input signals to the parts (9, 31, 33, 35, and 37) and the output signals from the parts, the levels of the signal strength (for example voltages), and/or frequencies etc. may be suitably set. For example, the frequency of the signal which is output from the second processing part 35 to the terminal 7 as explained above is 500 MHz to 10 GHz or 1 GHz to 10 GHz.

The power supply part 39 converts an electrical power supplied from the terminals 7 to an electrical power having a suitable voltage, current, and/or frequency (in a case of AC current) and supplies the power to the parts (31, 33, 35, and 37). The voltage, current, and/or frequency of the power supplied from the terminals 7 to the power supply part 39 may be suitable one. For example, the current supplied to the power supply part 39 is 100 mA to 1 A or 400 mA to 1 A.

(Hardware Configurations of Functional Parts)

The hardware configurations of the driving part 31, first processing part 33, second processing part 35, control part 37, and power supply part 39 shown in FIG. 2 may be suitable ones. For example, these functional parts (31, 33, 35, 37, and 39) are configured by one or more ICs. Among these functional parts, two or more functional parts may be configured by one IC. Conversely, one functional part may be configured by two or more ICs.

Further, the ICs (electronic components) configuring these functional parts (31, 33, 35, 37, and 39) may be mounted on the rigid board 23 (may be included in the assembly 11) or may be mounted on the flexible board 13. In the example in FIG. 2, one or more electronic components configuring the driving part 31, first processing part 33, and control part 37 are mounted on the rigid board 23. Further, one or more electronic components configuring the second processing part 35 and power supply part 39 are mounted on the flexible board 13.

Note that, FIG. 2 is just one example. Accordingly, for example, among the above plurality of functional parts (31, 33, 35, 37, and 39), just the one or more electronic components configuring the second processing part 35 may be mounted on the flexible board 13 or just the one or more electronic components configuring the power supply part 39 may be mounted on the flexible board 13. Otherwise, in addition to the second processing part 35 and power supply part 39, the one or more electronic components configuring the driving part 31 and/or control part 37 may be mounted on the flexible board 13. Further, the power supply part 39 may be configured by a plurality of electronic components, part of them may be mounted on the flexible board 13, and the remaining part may be mounted on the rigid board 23.

The electronic component mounted on the flexible board 13 as described above is the electronic component 15 explained with reference to FIG. 1. Accordingly, as will be understood from the above explanation, the electronic component 15 may be for example a power supply IC configuring the power supply part 39. Further, for example, in a case where the electronic component 15 is one configuring at least part of the second processing part 35, it may be a component generating an LVDS type signal. As will be understood from the explanation up to here, the division of the roles for realizing the configuration in FIG. 2 by one or more electronic components 15 may be suitably set.

As will be understood from FIG. 2, the terminals 7 and the assembly 11 may be indirectly electrically connected through the electronic component 15. That is, in the present embodiment, the flexible board 13 need not directly connect the terminals 7 and the assembly 11. However, in the explanation of the present disclosure, for convenience, sometimes it will be said that the flexible board 13 connects the terminals 7 and the assembly 11 including also indirect electrical connection through the electronic component 15.

The wiring pattern of the flexible board 13 is for example designed so that the flow of the signal or power supply current explained above is realized and the route thereof becomes simple. Accordingly, although not particularly shown, for example, the wiring pattern between the terminals 7 and the electronic component 15 is positioned in the terminal connection part 13a. The wiring pattern connecting the terminals 7 or electronic component 15 and the assembly 11 extends through the terminal connection part 13a and the relay part 13b in that order.

As explained above, in the present embodiment, the camera module 1 has the housing 3, lens 5, assembly 11, terminal 7, and electronic component 15. The housing 3 has the front surface part 3a, rear surface part 3b on the side opposite to that, and the side surface part 3d connecting the front surface part 3a and the rear surface part 3b. The lens 5 is exposed from the front surface part 3a. The assembly 11 includes the image sensor 9 and is positioned on the rear surface part 3b side relative to the lens 5. The terminal 7 is one for connection with the outside part and is located at the rear surface part 3b. The flexible board 13 includes a part extending from the assembly 11 toward the terminal 7 (relay part 13b and terminal connection part 13a). The electronic component 15 is mounted on the flexible board 13.

Further, from another viewpoint, the camera module 1 has the housing 3, lens 5, assembly 11, terminal 7, connection member (flexible board 13 in the present embodiment), and electronic component 15. The housing 3 has the front surface part 3a, rear surface part 3b on the side opposite to that, and side surface part 3d connecting the front surface part 3a and the rear surface part 3b. The lens 5 is exposed from the front surface part 3a. The assembly 11 includes the image sensor 9 and is positioned on the rear surface part 3b side relative to the lens 5. The terminals 7 is one for connection with the outside part and is located at the rear surface part 3b. The connection member (13) is a flexible member extending from the assembly 11 toward the terminal 7. The electronic component 15 is electrically connected with the assembly 11 and terminal 7 and is positioned in the housing 3 so that it is spaced apart from the assembly 11 toward the rear surface part 3b side.

Accordingly, compared with a camera module in which the electronic component is mounted on only the assembly 11, the plurality of electronic components in the housing 3 are easily mounted dispersed on the flexible board 13 and/or the side closer to the terminals 7 than the assembly 11. As a result, for example, the possibility of concentration of heat (that is, thermal noise) which is generated by the plurality of electronic components to the assembly 11 is reduced. Consequently, the possibility of transfer of heat to the image sensor 9 in the assembly 11 is reduced. Due to this, for example, an increase of dark current in the image sensor 9 is suppressed. Due to suppression of increase of the dark current, the possibility of rise of luminance compared with the actual amount of light received in part or all of the image is reduced. That is, the image quality is improved. Further, the flexible board 13 which electrically connects the assembly 11 and the terminal 7 is used also for mounting of the electronic component 15, so, for example, the possibility of an increase of the number of components is reduced.

Further, in the present embodiment, the flexible board 13 has the rear surface facing part 13c which faces the inner surface of the rear surface part 3b. Further, the electronic component 15 is mounted on the rear surface facing part 13c.

Accordingly, the electronic component 15 is mounted in a region on the flexible board 13 which is the most distant from the assembly 11 to the terminal 7 side. As a result, for example, the effect of reduction of the possibility of transfer of heat of the electronic component 15 to the image sensor 9 is improved. Further, the rear surface facing part 13c easily transfer heats to the rear surface part 3b and in turn easily dissipates the heat to the outside of the housing 3. Accordingly, from this viewpoint as well, the effect of reduction of the possibility of transfer of the heat of the electronic component 15 to the image sensor 9 is improved.

Further, in the present embodiment, the electronic component 15 may configure at least one of the power supply part 39 supplying power to the image sensor 9 and the second processing part 35 processing the signal from the image sensor 9.

In this case, the effect due to dispersion of the electronic components is further improved. Specifically, for example, this is as follows.

The power supply part 39 converts the supplied power to power with a suitable voltage and/or current and distributes the results to the parts, therefore a relatively large current flows into the power supply part 39 and a relatively small current flows from the power supply part 39 to the parts. Accordingly, when the power supply part 39 is provided in the assembly 11, a relatively large current flows from the terminals 7 to the assembly 11. On the other hand, when the power supply part 39 is provided on the flexible board 13, a relatively large current flows from the terminals 7 up to the middle of the flexible board 13 and a relatively small current flows from the middle up to the assembly 11. That is, the route through which a relatively large current flows becomes short. As a result, the amount of heat generated by supply of the power is reduced and in turn the amount of heat transferred to the image sensor 9 is reduced. Accordingly, not only is the amount of heat which is transferred to the image sensor 9 reduced due to separation of the heat generation source of the power supply part 39 from the image sensor 9, but also the amount of heat transferred to the image sensor 9 is reduced due to reduction of the amount of heat in the flexible board 13. Further, for example, the current easily can be kept lower than the upper limit current of the flexible board 13, therefore the degree of freedom of design is improved.

In recent years, higher performance has been demanded from vehicle-mounted cameras and other camera modules, therefore the power supplied to the camera module has tended to increase. For example, in a camera module for the same application as a camera module to which a current of about 100 mA was supplied, supply of about 500 mA of current is predicted. In such a case, the effect of reduction of the amount of heat and the effect of improvement of the degree of freedom of design as described above are particularly potent. Further, in a case where the power supply part 39 is provided in the terminal connection part 13a of the flexible board 13, the route from the terminal 7 up to the power supply part 39 can be made as short as possible, therefore the above effects are improved.

Further, if the power supply part 39 is provided on the flexible board 13, the image sensor 9 and its nearby functional parts (for example first processing part 33) included in the assembly 11 and the power supply part 39 are separated. As a result, for example, the possibility of influence of radiation noise and conduction noise which are caused by a high frequency signal such as a signal including information of an image exerted upon the current from the power supply part 39 is reduced.

Further, if the second processing part 35 is provided on the flexible board 13, the transmission route of the signal from the second processing part 35 to the terminal 7 can be made short. As a result, for example, mutual influence of the signal output from the second processing part 35 and the other signals or current can be reduced. As a result, for example, the image quality can be easily improved. Further, for example, by the transmission route being shorter as described above, the influence of the transmission route exerted upon impedance matching is reduced. As a result, impedance matching is facilitated. This result is effective at the time when the second processing part 35 generates and outputs an LVDS signal or other transmission-use signal which is easily given a higher frequency.

Second Embodiment

Figure 3:
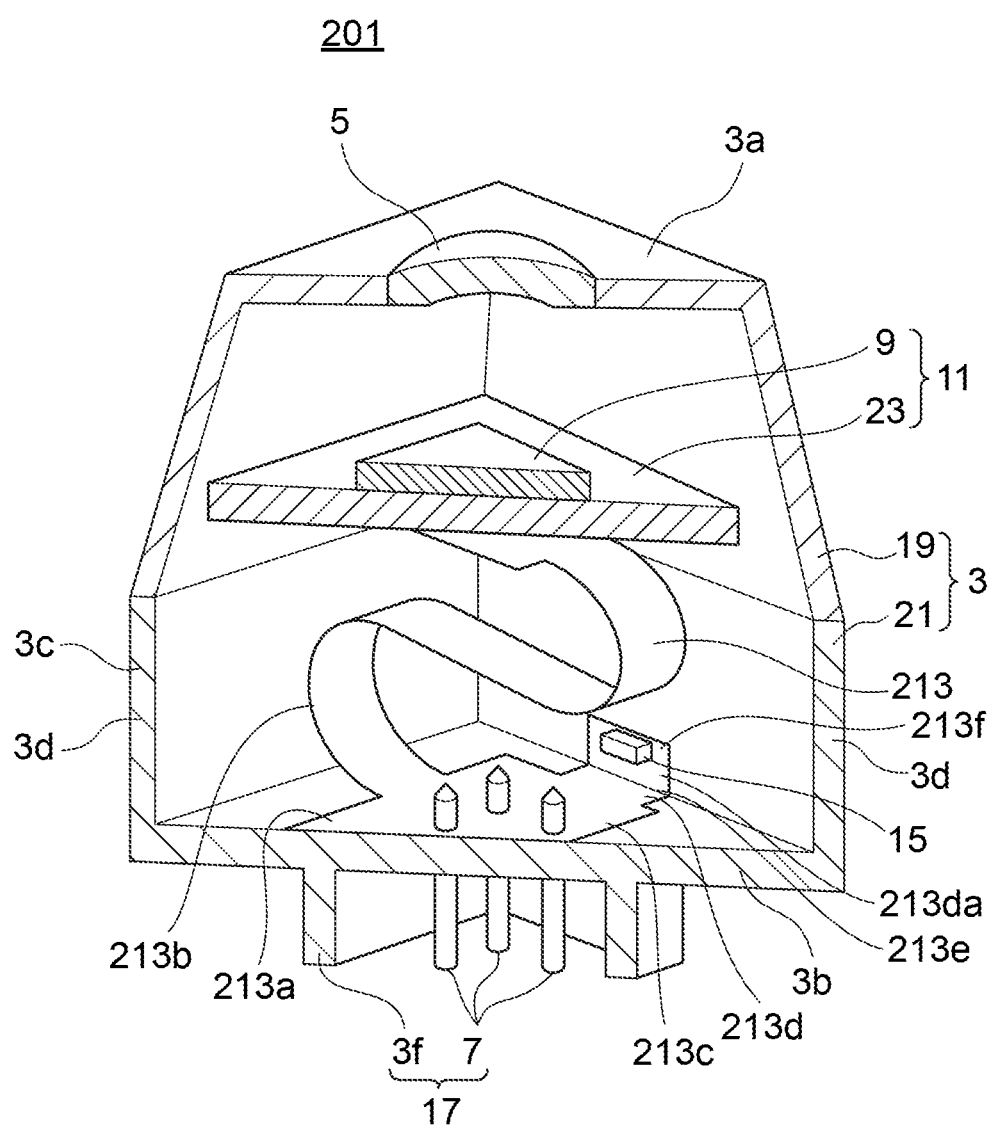
FIG. 3 is a schematic perspective view showing cutaway a camera module according to a second embodiment.

FIG. 3 is a schematic perspective view showing cutaway a camera module 201 according to a second embodiment.

The camera module 201 mainly differs from the camera module 1 in the first embodiment in the shape of the flexible board and the mounting position of the electronic component 15. Specifically, this is as follows.

A flexible board 213 in the camera module 201, in the same way as the flexible board 13 in the first embodiment, has a terminal connection part 213a and relay part 213b. Further, the flexible board 213 has an extending part 213d extending out of the terminal connection part 213a. Note that, as already explained, it may be viewed that the flexible board 13 in the first embodiment has the extending part 13d.

The extending part 213d in the present embodiment has a length long enough to extend out of the terminal connection part 213a and reach the side surface part 3d. In other words, the extending part 213d has an overlapping region 213da which can overlap the inner surface of the side surface part 3d.

Further, the extending part 213d, for example, substantially extends from the terminal connection part 213a along the inner surface of the rear surface part 3b and then bends to the assembly 11 side and extends along the inner surface of the side surface part 3d. Accordingly, from another viewpoint, the extending part 213d has a bent part 213e bent in the direction in which its surface is bent. Further, it has a side surface facing part 213f which faces the inner surface of the side surface part 3d. Note that, the part of the extending part 213d facing the rear surface part 3b forms a rear surface facing part 213c which faces the inner surface of the rear surface part 3b of the flexible board 213 together with the terminal connection part 213a or alone.

Although not particularly shown, the extending part 213d may be accommodated in the housing 3 in a manner different from the example shown, for example, one where the entirety thereof is gently curved with the inside part side of the housing 3 recessed. In the following explanation, mainly the explanation will be given with reference to the example of the case where the extending part 213d substantially runs along the inner surface of the housing 3 as in the example shown (same is true for third embodiment which will be explained later). Accordingly, in the following explanation, the "overlapping region 213da" and the "side surface facing part 213f" are substantially the same in meaning.

The mode relating to abutting or not abutting of the part facing the rear surface part 3b in the extending part 213d against the inner surface of the rear surface part 3b etc. may be the same as that of the terminal connection part 13a and is as explained in the first embodiment. Further, a mode relating to abutting or not abutting of the side surface facing part 213f against the inner surface of the side surface part 3d etc. may be made the same as the mode relating to abutting or not abutting of the part facing the rear surface part 3b against the inner surface of the rear surface part 3b etc.

Specifically, for example, the side surface facing part 213f may be bonded to the inner surface of the side surface part 3d by an adhesive or the like (bonding layer) or need not be bonded. The side surface facing part 213f may be in close contact with the inner surface of the side surface part 3d directly or indirectly through a suitable material (for example adhesive or grease) or may be separated from the inner surface of the side surface part 3d across a clearance. The close contact region is for example 80% or more or all of the area of the overlapping region 213da.

When the extending part 213d is not bonded to the inner surface of the housing 3 (for example the overlapping region 213da is not bonded to the inner surface of the side surface part 3d), the extending part 213d may be restricted from large displacement and/or movement by a very small force toward the inner side of the housing 3 or need not be restricted. Note that, where it is restricted, for example, the possibility of unwanted short-circuiting is reduced.

As the method of restricting movement such as described above, for example, in a case where the flexible board 213 generates a restoring force returning it to a flat shape, a method of utilizing this restoring force can be mentioned. The terminal connection part 213a is fixed with respect to the housing 3 at least at the positions of the terminals 7, therefore the restoring force acts as a force pushing the overlapping region 213da against the side surface part 3d. Further, for example, a not shown member pushing the overlapping region 213da against the side surface part 3d may be provided as well. Note that, the restoring force and/or member may contribute to keep at least a part of the extending part 213d in close contact with the inner surface of the housing 3 directly or indirectly (for example keep at least a part of the overlapping region 213da in contact with the inner surface of the side surface part 3d) as well.

The shape and size of the extending part 213d (overlapping region 213da) may be suitably set. In the example shown, the extending part 213d is substantially rectangular shaped so as to linearly extend in a direction perpendicular to one side of the terminal connection part 213d and to the side surface part 3d with a constant width. Further, the width of the extending part 213d is made narrower than the width of the terminal connection part 213a (length of one side to which the extending part 213d is connected). From another viewpoint, the width of the extending part 213d is made smaller than the width of the inner surface of the side surface part 3d (length of one side when viewed in the direction of the optical axis). Naturally, the extending part 213d may have a shape other than a rectangle. The width of the extending part 213d may be equal to or more than the width of the terminal connection part 213a or may be substantially equal to (for example 80% or more of) the width of the inner surface of the side surface part 3d.

Further, in the example shown, in the inner surface of the side surface part 3d, the overlapping region 213da (its front end) is positioned relatively distant from the assembly 11. For example, the overlapping region 213da is contained on the side closer to the rear surface part 3b than a center position between the assembly 11 and the inner surface of the rear surface part 3b. However, the overlapping region 213da may expand toward the side closer to the assembly 11 than the center position as well. As explained above, the width of the overlapping region 213da may be made equal to the width of the side surface part 3d. Together with this, the overlapping region 213da may have an area corresponding to the majority (for example 80% or more) of a part of the inner surface of the side surface part 3d on the side closer to the rear surface part 3b than the assembly 11.

The bent part 213e is for example bent by substantially 90°. The curvature thereof (from another viewpoint, the length of the bent part 213e from the rear surface part 3b to the side surface part 3d) may be suitably set. In the example shown, the corner part is formed by a flat inner surface of the rear surface part 3b and a flat inner surface of the side surface part 3d crossing each other. However, the corner part may be chamfered to flat surface or curved surface as well. In this case, the bent part 213e more easily abuts against the inner surface of the housing 3. Further, in the example shown, the extending part 213d has a part facing the inner surface of the rear surface part 3b and a part facing the inner surface of the side surface part 3d, and the bent part 213e becomes the part between the two. However, the bent part 213e may be configured by curving all or most of the extending part 213d as well.

The bent part 213e, in the same way as the overlapping region 213da etc., may be bonded to the inner surface of the housing 3 or need not be bonded to it. Further, it may be in close contact with the inner surface of the housing 3 directly or indirectly through a suitable material (for example adhesive or grease) or need not be in close contact with the surface. Further, the bent part 213e may be restricted in movement to the inner side of the housing 3 by the restoring force of the flexible board 13 or a suitable member.

The electronic component 15 is mounted in the overlapping region 213da. Note that, as described above, when at least part of the overlapping region 213da is in close contact with the inner surface of the side surface part 3d, that close contact region may include the region in which the electronic component 15 is mounted. Further, from another viewpoint, the electronic component 15 is positioned on the front end side of the extending part 213d relative to the bent part 213e (opposite side to the terminal connection part 213a side).

Note that, the shape of the flexible board and the mounting position of the electronic component 15 are different from those in the first embodiment. Therefore, naturally, the wiring pattern of the flexible board is also different from that in the first embodiment. However, in the same way as the first embodiment, the wiring pattern may be designed so that the configuration of the signal processing system in FIG. 2 is realized and the route becomes simple. For example, the wiring pattern connecting the terminal 7 and the electronic component 15 extends through the terminal connection part 213a and the extending part 213d in that order. The wiring pattern connecting the electronic component 15 and the assembly 11 extends through the extending part 213d, terminal connection part 213a, and the relay part 213b in that order.

As explained above, in the present embodiment as well, the electronic component 15 is mounted on the flexible board 213, which includes a part extending from the assembly 11 to the terminal 7 (relay part 213b and terminal connection part 213a). From another viewpoint, the electronic component 15 is positioned in the housing 3 spaced apart from the assembly 11 to the rear surface part 3b side. Accordingly, the same effects as those by the first embodiment are obtained. For example, by dispersion of the electronic components, thermal noise in the image sensor 9 is reduced, therefore the image quality is improved.

Further, in the present embodiment, the flexible board 213 has the terminal connection part 213a, relay part 213b, and extending part 213d. The terminal connection part 213a faces the inner surface of the rear surface part 3b and is connected with the terminal 7. The relay part 213b extends from part of the outer edge of the terminal connection part 213a up to the assembly 11. The extending part 213d extends out of the other part of the outer edge of the terminal connection part 213a. Further, the electronic component 15 is mounted in the extending part 213d.

Accordingly, for example, the electronic component 15 can be mounted at a position which is separated from both of the assembly 11 and the terminal 7. As a result, for example, the heat sources can be further dispersed. Further, for example, the extending part 213d is provided at the flexible board 213, therefore the area in which the electronic component 15 can be mounted increases. Accordingly, for example, it is easy to increase the number of electronic components 15 to be mounted on the flexible board 213. As a result, it is also made easier to meet with the demand for increase of functions of the camera module 201.

Further, in the present embodiment, the extending part 213d has the overlapping region 213da capable of overlapping the inner surface of the side surface part 3d. The electronic component 15 is mounted at the overlapping region 213da. From another viewpoint, the flexible board 213 has a side surface facing part 213f which faces the inner surface of the side surface part 3d. The electronic component 15 is mounted at the side surface facing part 213f.

Accordingly, for example, compared with the first embodiment, the electronic components can be dispersed to not only the inner surface of the rear surface part 3b, but also the inner surface of the side surface part 3d. As a result, for example, not only heat dissipation from the rear surface part 3b, but also heat dissipation from the side surface part 3d are facilitated. Consequently, the thermal noise is reduced. Further, the region in which the electronic component 15 can be mounted expands also to the inner surface of the side surface part 3d, therefore it is also made easier to meet the demand for increase of functions of the camera module 201. Further, for example, when mounting the electronic component 15 configuring the power supply part 39 at the rear surface facing part 213c and mounting the electronic component 15 configuring the second processing part 35 at the overlapping region 213d a, the high frequency signal (for example, LVDS signal) which is output from the second processing part 35 is easily separated from the power supply current. As a result, for example, mutual influence of the two is reduced. Further, for example, even in a case where a space capable of mounting the electronic component 15 cannot be secured on the inner surface of the rear surface part 3b, a plurality of electronic components can be dispersed.

Further, in the present embodiment, the extending part 213d (extended part) has the bent part 213e which is bent in the direction of bending the surface of the flexible board 213 on the side closer to the root than the electronic component 15 (terminal connection part 213a side).

Accordingly, for example, the possibility of transfer of vibration to the electronic component 15 which was transferred from the outside part to the terminals 7 is reduced. Specifically, for example, the vibration of the terminal connection part 213a is absorbed by the bent part 213e. Further, for example, the space in the housing 3 accommodating the terminals 7 and electronic component 15 therein is small as it is, while the distance of the flexible board 213 between the terminals 7 and the electronic component 15 is secured. Therefore, from this viewpoint as well, vibration becomes harder to be transferred. By reduction of the possibility of transfer of vibration to the electronic component 15, for example, a possibility of peel off of the electronic component 15 is reduced. Such an effect is for example potent when the camera module 201 is a vehicle mounted one.

Third Embodiment

Figure 4A:
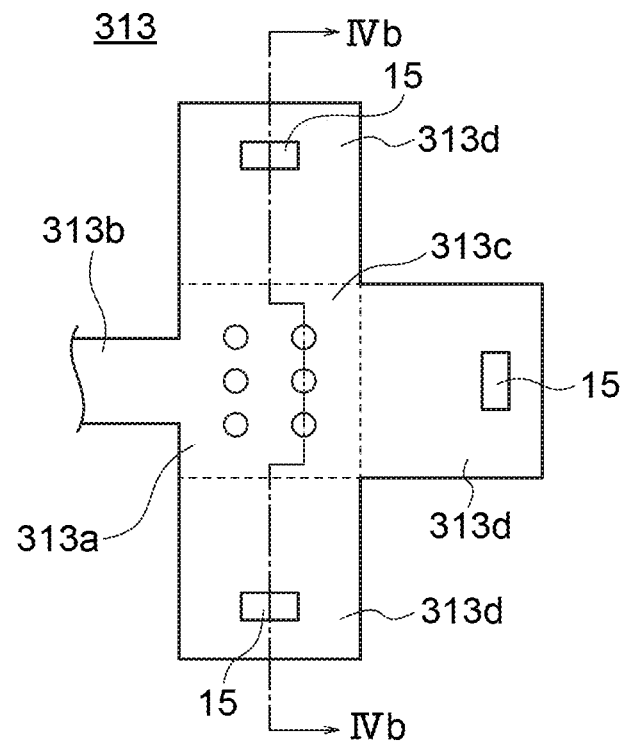
FIG. 4A is a laid open view showing part of a flexible board provided in a camera module according to a third embodiment.
Figure 4B:
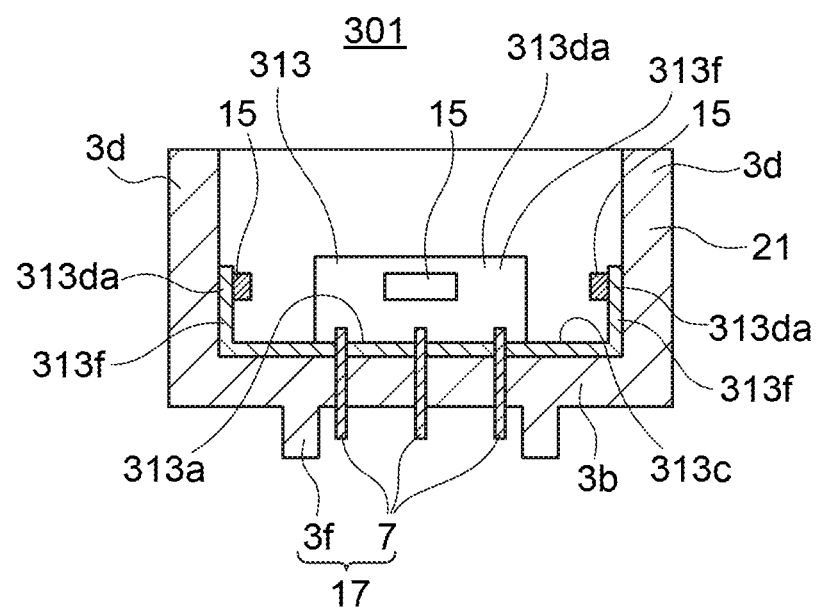
FIG. 4B is a cross-sectional view showing part of the camera module according to the third embodiment.

FIG. 4A is a laid open view showing part of a flexible board 313 provided in a camera module 301 according to a third embodiment. FIG. 4B is a cross-sectional view showing part of the camera module 301 and corresponds to the IVb-IVb line in FIG. 4A.

The camera module 301 mainly differs from the camera module 201 in the second embodiment in the shape of the flexible board. Specifically, this is as follows.

The flexible board 313, in the same way as the first and second embodiments, has a terminal connection part 313a and a relay part 313b. Further, the flexible board 313, in the same way as the second embodiment, has an extending part 313d including an overlapping region 313da (side surface facing part 313f). However, unlike the second embodiment, a plurality of extending parts 313d are provided.

The plurality of extending parts 313d extend from the terminal connection part 313a toward a plurality of side surface parts 3d which are different from each other, and a plurality of overlapping regions 313da can overlap the mutually different side surface parts 3d. More specifically, for example, the extending parts 313d are provided for three side surface parts 3d among the four side surface parts 3d. The remaining one side surface part 3d becomes the side surface part 3d on the side of extending out of the relay part 313b. Accordingly, the total of numbers of the relay part 313b and extending parts 313d, and the number of the side surface parts 3d are the same.

Note that, the number of the plurality of extending parts 313d is not limited to the number of the side surface parts 3d minus one. For example, the number of the plurality of extending parts 313d may be the number of the side surface parts 3d minus two by no provision of the relay part 313b and extending part 313d which extend toward any of the plurality of side surface parts 3d. Further, even in a case where the shape of the part on the terminal 7 side in the housing 3 is a prism other than a quadratic prism, in the same way, the number of the plurality of extending parts 313d may be the number of the side surface parts 3d minus one or may be a number different from this (for example the number minus 2 or more). Further, for example, one extending part 313d may face two sides (two side surface parts 3d) crossing at an obtuse angle when viewed in the direction of the optical axis as well.

The shape, arrangement, etc. of each extending part 313d itself and the position of arrangement of the electronic component 15 in each extending part 313d may be made the same as those in the extending part 213d in the second embodiment. The widths of the extending parts are different between FIG. 3 and FIG. 4A. However, these widths may be suitably set as explained in the explanation of the second embodiment. Further, it was explained in the explanation of the first embodiment that the division of the roles of the plurality of electronic components 15 for realizing the configuration of the signal processing system in FIG. 2 may be suitably set. The same is true for the plurality of electronic components 15 mounted in the plurality of extending parts 313d.

As explained above, in the present embodiment, the housing 3 has the plurality of side surface parts 3d along the outer edges of the front surface part 3a and rear surface part 3b. The flexible board 313 has the plurality of extending parts 313d which extend from the terminal connection part 313a toward mutually different side surface parts 3d. Any of the plurality of electronic components 15 is mounted in the overlapping region 313da of each of the plurality of extending parts 313d.

Accordingly, for example, the effects explained in the second embodiment are improved. Specifically, for example, the effect that the electronic components are dispersed to not only the inner surface of the rear surface part 3b, but also to the inner surfaces of the side surface part 3d and the heat of the electronic components 15 is dissipated from the side surface part 3d is improved. Further, for example, when the flexible board 313 generates a restoring force returning it to the flat shape, the plurality of extending parts 313d abut against the side surface parts 3d in mutually different directions and receive power resistant against the restoring force. As a result, for example, before fixation of the terminal connection part 313a to the rear surface part 3b, the flexible board 313 is easily held in the position of a rear side housing 21 in a state where the terminal connection part 313a is made to face the rear surface part 3b. Consequently, work of fixing the flexible board 313 with respect to the rear side housing 21 is facilitated.

The above effects are improved when the total of the numbers of the relay part 313b and the extending parts 313d and the number of the side surface parts 3d are the same. Further, the effect of holding the position by the restoring force is improved when at least two extending parts 313d extend to inverse directions to each other.

Fourth Embodiment

Figure 5:
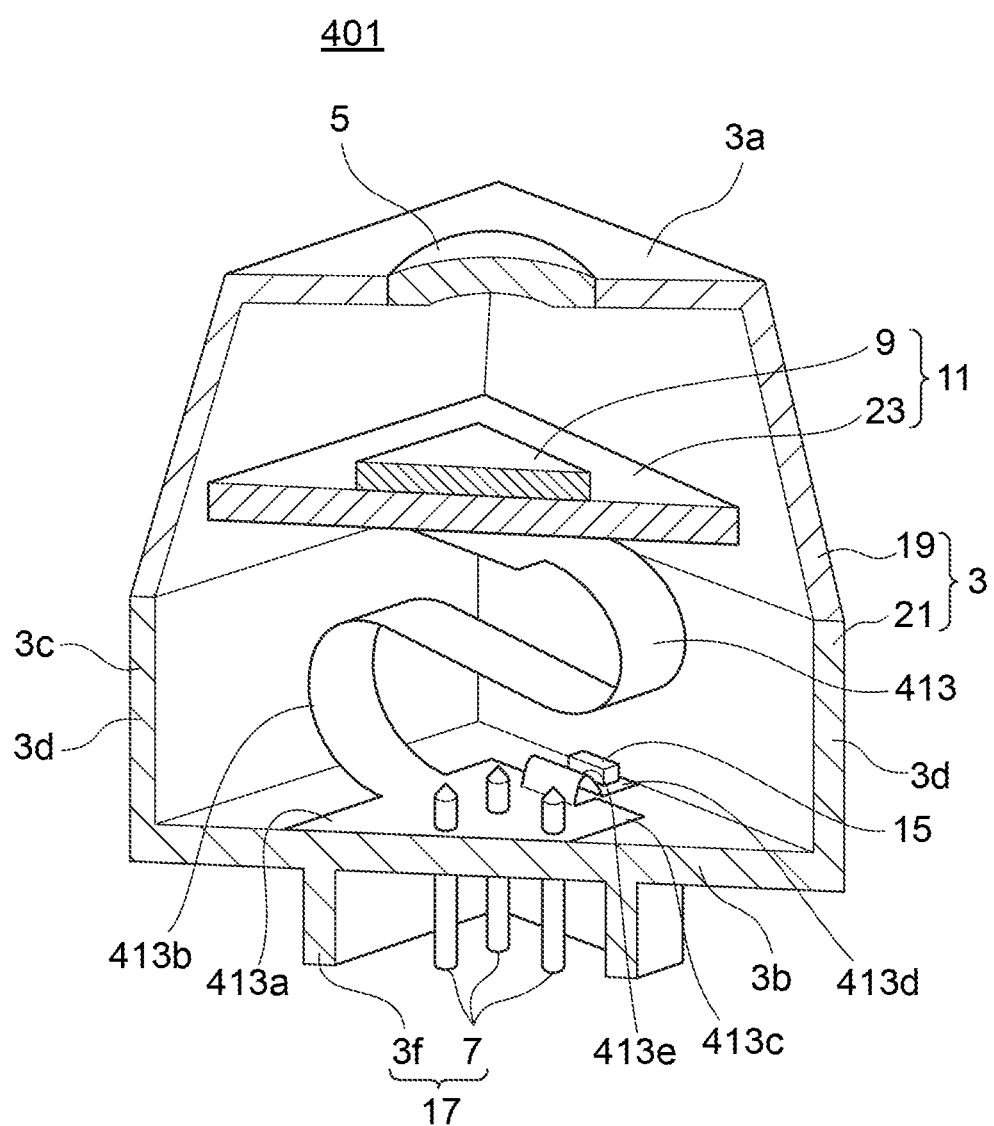
FIG. 5 is a schematic perspective view showing cutaway a camera module according to a fourth embodiment.

FIG. 5 is a schematic perspective view showing cutaway a camera module 401 according to a fourth embodiment.

The camera module 401 mainly differs from the camera module 1 in the first embodiment in the shape of the flexible board. Specifically, this is as follows.

A flexible board 413 in the camera module 401, in the same way as the flexible board 13 in the first embodiment, has a terminal connection part 413a and relay part 413b. Further, the flexible board 413 has an extending part 413d extending out of the terminal connection part 413a.

The extending part 413d in the present embodiment, for example, in order from the terminal connection part 413a side, is bent to the assembly 11 side, is bent to an inverse side to the former (substantially folded back), and is further bent to an inverse side to that. That is, the extending part 413d has a bent part 413e which alternately bends three times in a direction of bending the surface of the flexible board 413.

The electronic component 15 is mounted in the part of the extending part 413d which is closer to the front end side than the bent part 413e (side opposite to the terminal connection part 413a). This part closer to the front end side than the bent part 413e for example faces the inner surface of the rear surface part 3b. This front end side part configures the rear surface facing part 413c facing the inner surface of the rear surface part 3b together with the terminal connection part 413a or alone.

The bent part 413e, for example, is not fixed to, is not bonded to, or is not in close contact with the housing 3 (rear surface part 3b) and becomes a floating state. The part closer to the front end side than the bent part 413e, in the same way as the rear surface facing parts in the other embodiments, may be suitably set in bonding or not boding and/or close contact or not close contact and its form.

The root part of the extending part 413d (part or all of the bent part 413e) is configured by cutting one side of a rectangle of the terminal connection part 413a. Note that, even if one side of the rectangle is cut in this way, the extending part 413d may be grasped as extending out of the outer edge of the terminal connection part 413a (a shape where one side of a rectangle has a notch may be grasped as the shape of the terminal connection part 413a).

The curvature and length of the bent part 413e may be suitably set. The width of the extending part 413d (bent part 413e), in the same way as FIG. 3, is made shorter than the length of one side of the terminal connection part 413a connected with the extending part 413d. However, the extending part 413d (bent part 413e), in the same way as FIG. 4A, may have an equal width to the length of one side of the terminal connection part 413a as well.

As explained above, in the present embodiment, the extending part 413d (extended part) has the bent part 413e bent in the direction of bending the surface of the flexible board 413 on the side closer to the root than the electronic component 15. The bent part 413e is alternately bent two or more times in the direction of bending the surface of the flexible board 413.

Accordingly, the effects by the bent part 213e explained in the explanation of the second embodiment are improved. For example, the effect of reduction of the possibility of transfer of vibration of the terminals 7 to the electronic component 15 is improved. The bent part 413e which is alternately bent two or more times is not only bent, but also can extend and contract or otherwise move, so can absorb the vibration by this extension and contraction. Accordingly, the effect of reduction of vibration is drastically improved. Further, bending of the bent part 413e two or more times means a three-dimensional arrangement in the housing, so the space of the inside part of the housing 3 can be effectively utilized.

Fifth Embodiment

Figure 6:
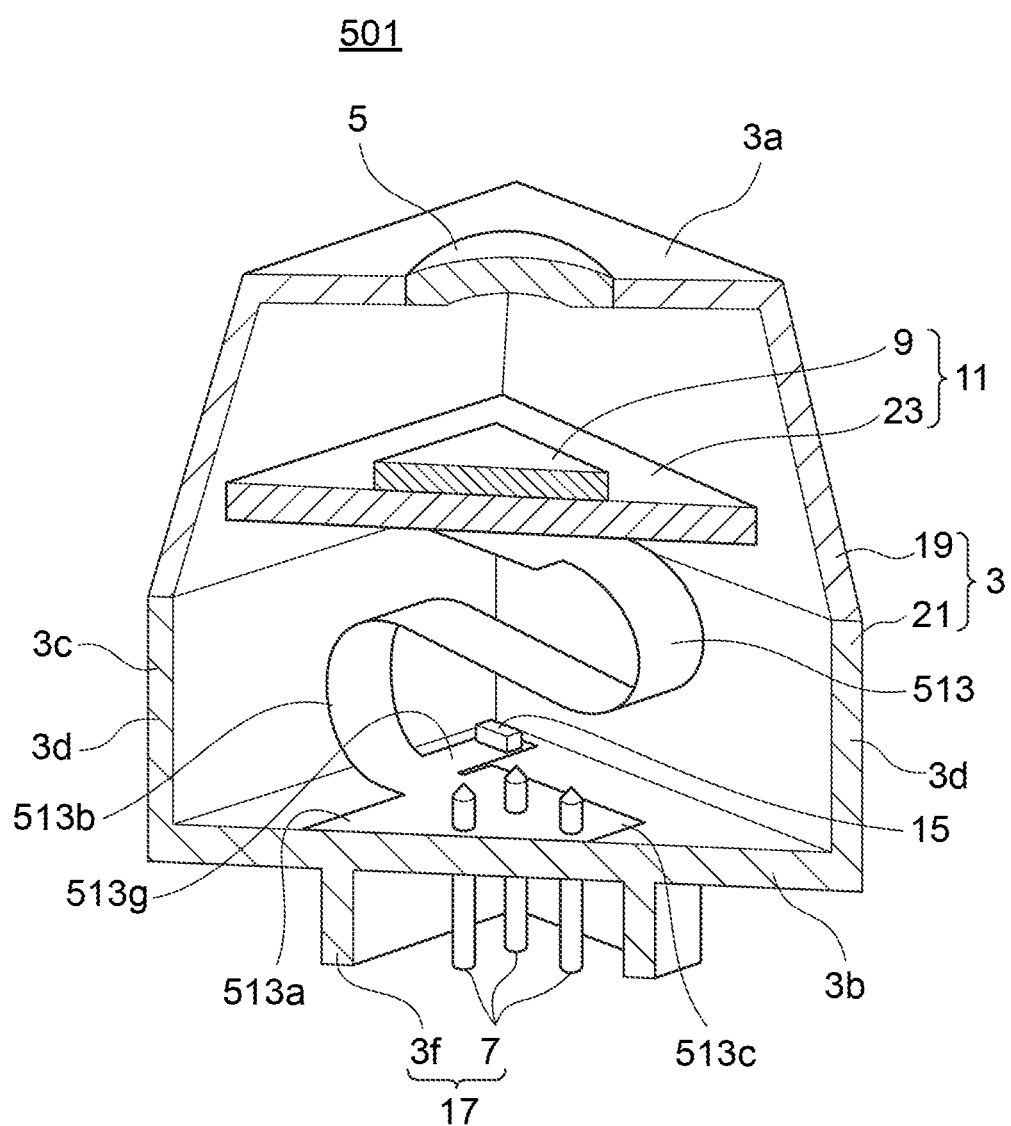
FIG. 6 is a schematic perspective view showing cutaway a camera module according to a fifth embodiment.

FIG. 6 is a schematic perspective view showing cutaway a camera module 501 according to a fifth embodiment.

The camera module 501 mainly differs from the camera module 1 in the first embodiment in the shape of the flexible board. Specifically, this is as follows.

A flexible board 513 in the camera module 501, in the same way as the flexible board 13 in the first embodiment, has a terminal connection part 513a and relay part 513b. Further, the flexible board 513 has a branched part 513g extending out of the relay part 513b so as to be branched with respect to the terminal connection part 513a. Further, the electronic component 15 is mounted in that branched part 513g.

The position, shape, and size of the branched part 513g may be suitably set. In the example shown, the branched part 513g extends out of the part of the relay part 513b on the terminal connection part 513a side in a direction substantially perpendicular to the relay part 513b (from another viewpoint, a direction toward one side surface part 3d). After that, the branched part 513g extends substantially along the inner surface of the rear surface part 3b. The front end thereof does not reach the side surface part 3d. However, the branched part 513g may have a part that reaches the side surface part 3d and faces the side surface part 3d (part corresponding to the overlapping region 213da in the second embodiment) as well. The shape of the branched part 513g is for example made a substantially rectangular shape As described above, the branched part 513g faces the inner surface of the rear surface part 3b in at least part (in the example shown, at least part on the front end side). The electronic component 15 is for example mounted at this part facing the inner surface of the rear surface part 3b. However, the electronic component 15 may be mounted in a part of the branched part 513g which does not face the rear surface part 3b as well. For example, the electronic component 15 may be mounted on the part which is close to the relay part 513b and is in a floating state. Otherwise, when the branched part 513g has the part facing the side surface part 3d as described above, it may be mounted at this part.

In the branched part 513g, the part facing the rear surface part 3b forms the rear surface facing part 513c facing the inner surface of the rear surface part 3b of the flexible board 513 together with the terminal connection part 513a or alone. The part in the branched part 513g which faces the rear surface part 3b, in the same way as the rear surface facing parts in the other embodiments, may be suitably set in bonding or not bonding and/or close contact or not close contact and its form. The same is true for a case where the branched part 513g has a side surface facing part facing the inner surface of the side surface part 3d.

Unlike the extending part 213d in the second embodiment etc., the branched part 513g extends from not the terminal connection part 513a, but the relay part 513b. Therefore, naturally, the wiring pattern of the flexible board also differs from those in the other embodiments. However, in the same way, the wiring pattern may be designed so that the configuration of the signal processing system in FIG. 2 is realized and the route becomes simpler. For example, the wiring pattern connecting the terminal 7 and the electronic component 15 extends through the terminal connection part 513a, a part of the relay part 513b on the terminal connection part 513a side, and the branched part 513g in that order. The wiring pattern connecting the electronic component 15 and the assembly 11 extends through the branched part 513g and a part of the relay part 513b on the assembly 11 side in that order.

As explained above, in the present embodiment, the flexible board 513 has the branched part 513g which extends out of the relay part 513b so as to be branched with respect to the terminal connection part 513a. The electronic component 15 is mounted at the branched part 513g.

Accordingly, for example, compared with the second embodiment in which the electronic component 15 is mounted at the extending part 213d extending out of the terminal connection part 213a, the relay part 513b is able to function as a buffer part for attenuation of vibration from the terminal connection part 513a to the electronic component 15. As a result, for example, peel off of the electronic component 15 is suppressed. Note that, in the second embodiment, for example, the extending part 213d connected to the terminal connection part 213a without going through the relay part 213b, whereby the route between the terminals 7 and the electronic component 15 is made short and heat generation and/or superposition of noise in the route can be suppressed.

Sixth Embodiment

Figure 7:
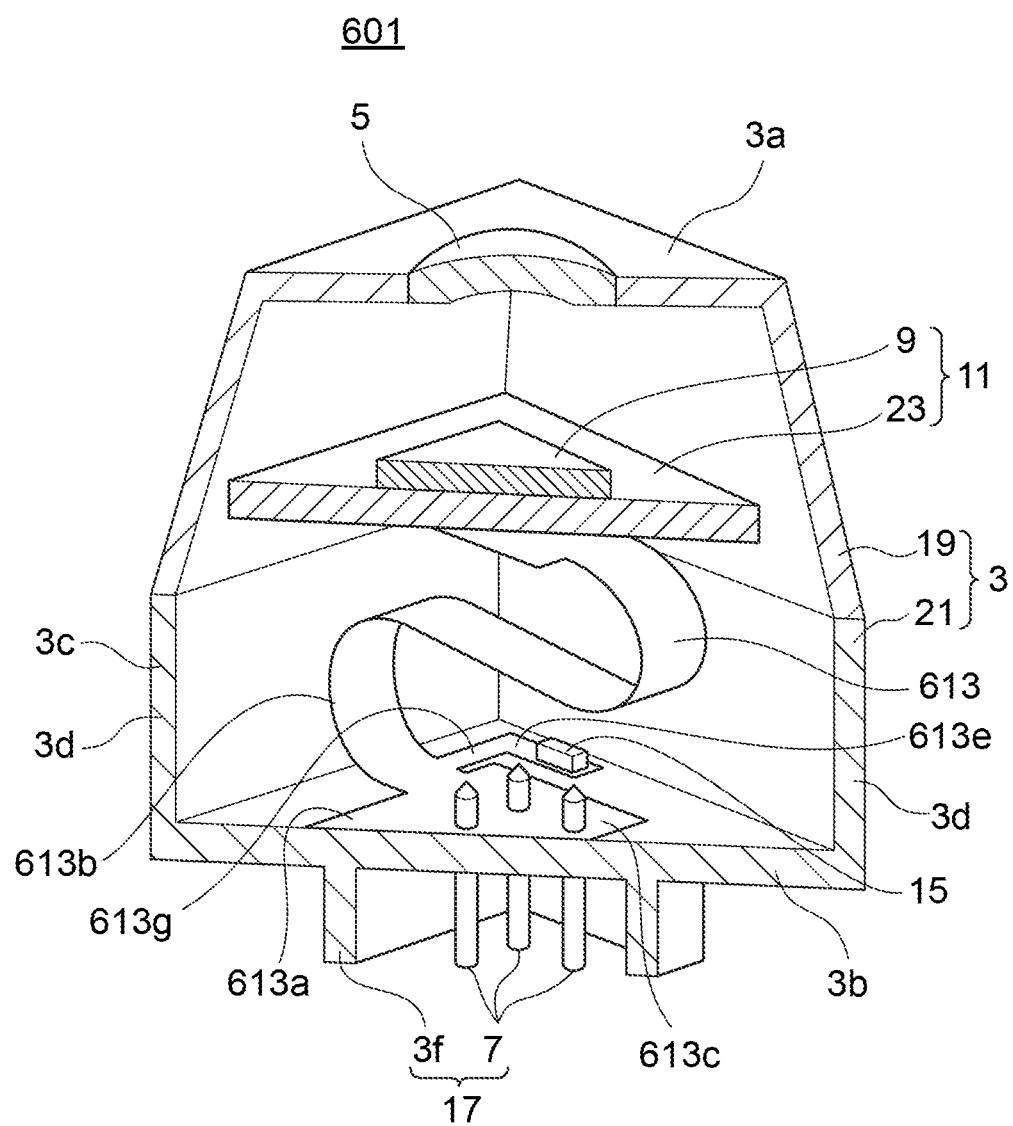
FIG. 7 is a schematic perspective view showing cutaway a camera module according to a sixth embodiment.

FIG. 7 is a schematic perspective view showing cutaway a camera module 601 according to a sixth embodiment.

The camera module 601 mainly differs from the camera module 1 in the first embodiment in the shape of the flexible board. Specifically, this is as follows.

A flexible board 613 in the camera module 601, in the same way as the flexible board 513 in the fifth embodiment, has a terminal connection part 613a, relay part 613b, and branched part 613g. However, the branched part 613g has a bent part 613e. The electronic component 15 is mounted in the part of the branched part 613g which is closer to the front end side than the bent part 613e (side opposite to the relay part 613b).

The bent part 613e is a part which is bent when viewed on a plane when laying open the flexible board 613. The overall shape and various dimensions of the branched part 613g including the bent part 613e and the position in the housing 3 may be suitably set.

For example, the branched part 613g, in the same way as the branched part 513g in the fifth embodiment, extends out of the relay part 613b in a direction substantially perpendicular to the relay part 613b (from another viewpoint, a direction toward one side surface part 3d). After that, the branched part 613g, when viewed in the direction of the optical axis, is bent at an angle of substantially 90° in a manner making a corner before arrival at the inner surface of the side surface part 3d toward which the branched part 613g extended and extends along the inner surface of the side surface part 3d. That is, the shape of the branched part 613g is a substantially L-shape. The two linear parts configuring the L-shape are for example rectangles.

Note that, the branched part 613g (extended part), when viewed in the direction of the optical axis, can be grasped as extending along the shape of the inner surface of the outer circumferential surface part 3c. Further, from another viewpoint, when viewed in the direction of the optical axis, the branched part 613g can be grasped as extending along the outer edges of the terminal connection part 613a. The angle of bending of the bent part 613e (for example angle formed by the center line in the root side part and the center line in the front end side part in the branched part 613g) can be grasped as the same angle as the angle formed by the two side surface parts 3d (or two sides of the terminal connection part 613a).

However, the branched part 613g, when viewed in the direction of the optical axis, need not run along the inner surface of the outer circumferential surface part 3c and/or the outer edges of the terminal connection part 613a. The angle of the bent part 613e may be an angle other than 90°. The bent part 613e need not be bent in a manner making a corner, but may be curved. In the case of bending in the manner making the corner, the outer edge may be suitably chamfered. The branched part 613g may be the same in width between the front and the rear of the bent part 613e or need not be the same. The length of the branched part 613g may be suitably set.

The branched part 613g, for example, in the same way as the branched part 513g in the fifth embodiment, faces the inner surface of the rear surface part 3b in at least part. In the example shown, in the branched part 613g, the majority including the front end faces the inner surface of the rear surface part 3b. Also, the part closer to the front end side than the bent part 613e at which the electronic component 15 is mounted, for example, faces the inner surface of the rear surface part 3b. In the branched part 613g, the part facing the rear surface part 3b forms the rear surface facing part 613c facing the inner surface of the rear surface part 3b of the flexible board 613 together with the terminal connection part 613a or alone. The part facing the rear surface part 3b in the branched part 613g, in the same way as the rear surface facing parts in the other embodiments, may be suitably set in bonding or not bonding and/or close contact or not close contact and its form.

As explained above, in the present embodiment, the electronic component 15 is mounted at the branched part 613g (extended part). The branched part 613g, on the side closer to the root than the electronic component 15 (side closer to the relay part 613b), has the bent part 613e which is bent when viewed on a plane when laying open the flexible board 613.

Accordingly, for example, the possibility of transfer to the electronic component 15 of the vibration which was transferred from the outside part to the terminals 7 is reduced. Specifically, for example, the vibration is easily absorbed by the bent part 613e. Further, for example, the space in the housing 3 accommodating the terminals 7 and the electronic component 15 therein is small as it is, while the distance of the flexible board 613 between the terminals 7 and the electronic component 15 is secured. Therefore, also from this viewpoint, vibration becomes harder to be transferred. Due to reduction of the possibility of transfer of vibration to the electronic component 15, for example, the possibility of peel off of the electronic component 15 is reduced.

Seventh Embodiment

Figure 8:
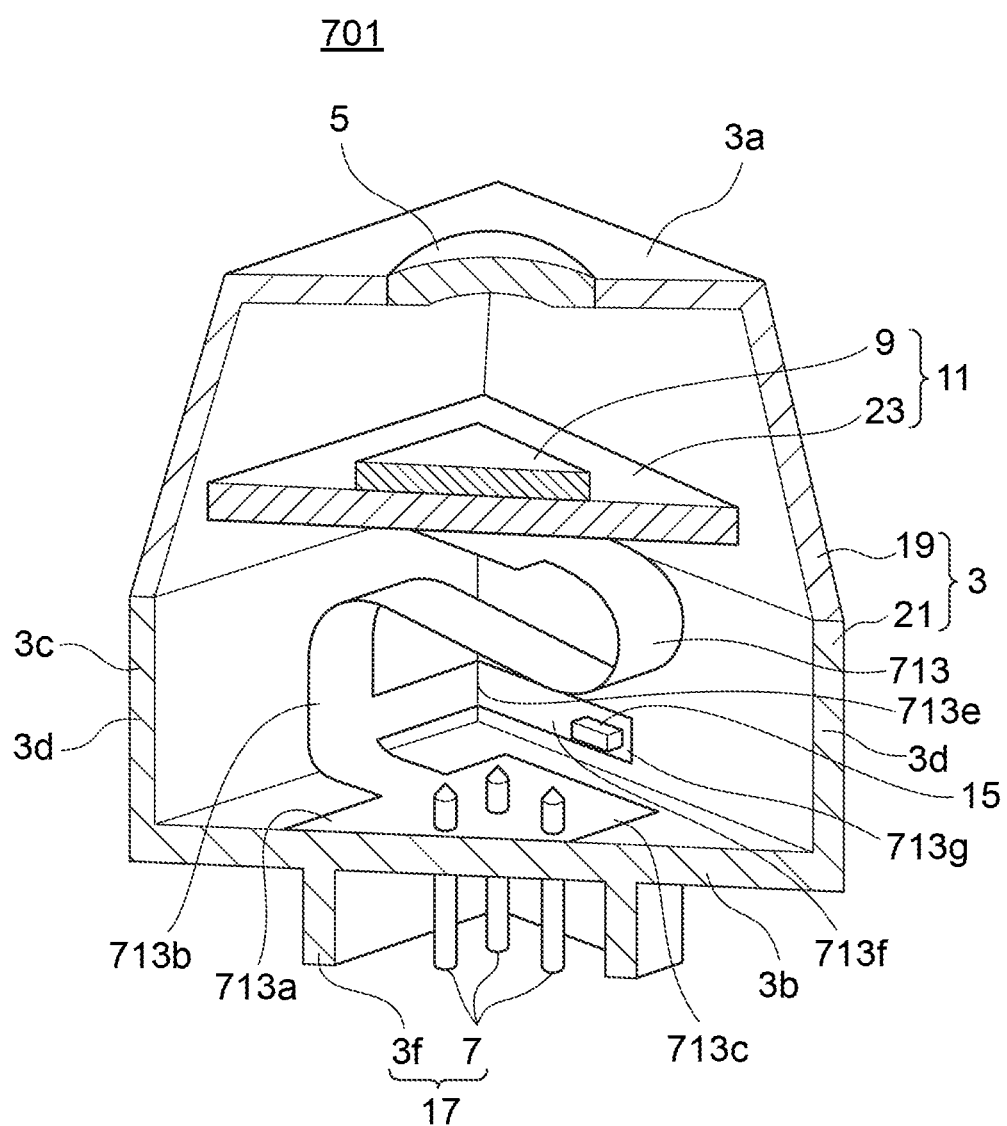
FIG. 8 is a schematic perspective view showing cutaway a camera module according to a seventh embodiment.

FIG. 8 is a schematic perspective view showing cutaway a camera module 701 according to a seventh embodiment.

The camera module 701 mainly differs from the camera module 1 in the first embodiment in the shape of the flexible board. Specifically, this is as follows.

A flexible board 713 in the camera module 701, in the same way as the flexible board 513 in the fifth embodiment, has a terminal connection part 713a, relay part 713b, and branched part 713g. Further, in the same way as the branched part 613g in the sixth embodiment, the branched part 713g has a bent part 713e, and the electronic component 15 is mounted at the part of the branched part 713g which is closer to the front end side than the bent part 713e. However, the branched part 713g, unlike the fifth and sixth embodiments, extends so that its surface runs along the inner surface of the outer circumferential surface part 3c.

Specifically, for example, first, the branched part 713g extends out of the part of the relay part 713b which is somewhat separated from the terminal connection part 713a. This part in the relay part 713b from which the branched part 713g extends is for example the part in the relay part 713b which is closest to the inner surface of the outer circumferential surface part 3c. This part may make its surface abut against the inner surface of the outer circumferential surface part 3c by the restoring force of the relay part 713b returning it back to the flat state as well.

Further, the branched part 713g extends along the first side surface part 3d which the relay part 713b approaches and further extends along the second side surface part 3d crossing the first side surface part 3d. The part of the branched part 713g which moves from the first side surface part 3d to the second side surface part 3d, in the same way as the bent part 213e in the second embodiment (FIG. 3), becomes the bent part 713e bent in the direction of bending of the surface of the flexible board 713.

The overall shape, various dimensions, and the position in the housing 3 of the branched part 713g may be suitably set. In the example shown, the branched part 713g substantially has a long shape so as to linearly extend with a constant width. Further, the branched part 713g (electronic component 15) is contained on the side closer to the rear surface part 3b than the center position between the assembly 11 and the inner surface of the rear surface part 3b. However, the branched part 713g may be positioned in part or whole on the side closer to the assembly 11 than the center position as well. Also the length of the branched part 713g may be suitably set.

At least a part of the branched part 713g (for example the region where the electronic component 15 is mounted) configures for example a side surface facing part 713f facing the side surface part 3d. In the same way as the side surface facing part 213f in the second embodiment (FIG. 3), the side surface facing part 713f may be suitably set in bonding or not bonding and/or close contact or not close contact and its form.

As explained above, in the present embodiment as well, the electronic component 15 is mounted on the flexible board 713 including the part extending from the assembly 11 toward the terminals 7 (relay part 713b and terminal connection part 713a). From another viewpoint, the electronic component 15 is positioned in the housing 3 separated from the assembly 11 toward the rear surface part 3b side. Accordingly, the same effects as those by the other embodiments are exhibited. For example, due to dispersion of the electronic components, thermal noise in the image sensor 9 is reduced, therefore the image quality is improved.

Further, in the present embodiment, the branched part 713g extending out of the relay part 713b is arranged so as to extend along the inner surfaces of the side surface parts 3d. Accordingly, for example, compared with the sixth embodiment (FIG. 7), the branched part 713g has a higher degree of freedom of design relative to the position in the direction of the optical axis. Note that, in the sixth embodiment, for example, compared with the present embodiment, the branched part 613g can be separated from the assembly 11 as much as possible.

(Reference Potential Layer of Flexible Board)

As already explained, the flexible board connecting the assembly 11 and the terminals 7 may be a single-sided board, may be a double-sided board, or may be a multilayer board. Here, when the flexible board is the double-sided board or multilayer board, the reference potential layer may be provided in a layer different from the layer provided with the wiring pattern as well.

Figure 9A:
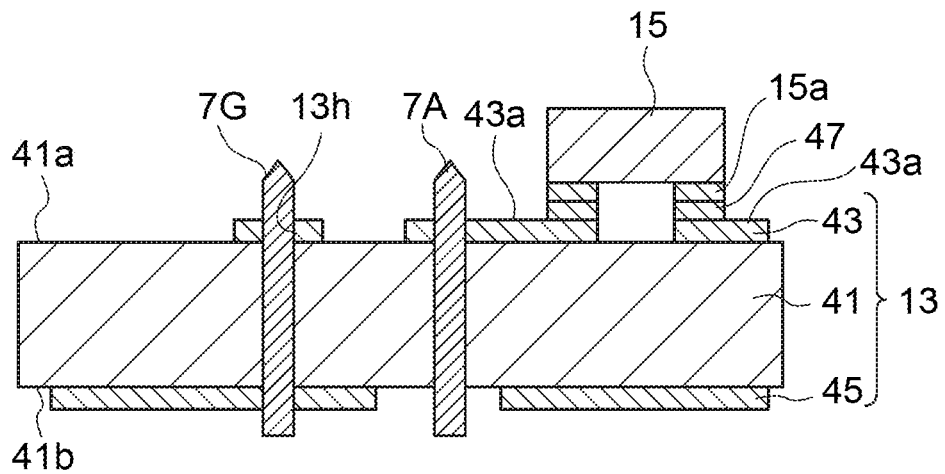
FIG. 9A, FIG. 9B, and FIG. 9C are a cross-sectional view, a top view, and a bottom view showing an example of a flexible board having a reference potential layer.
Figure 9B:
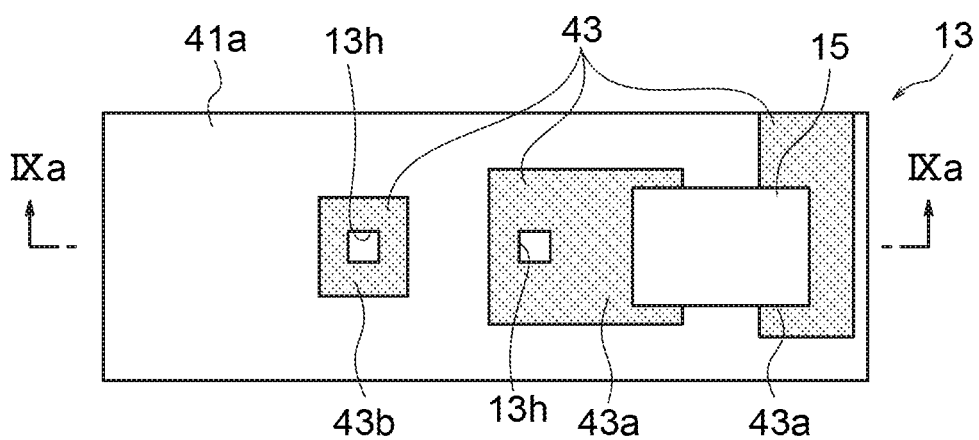
Figure 9C:
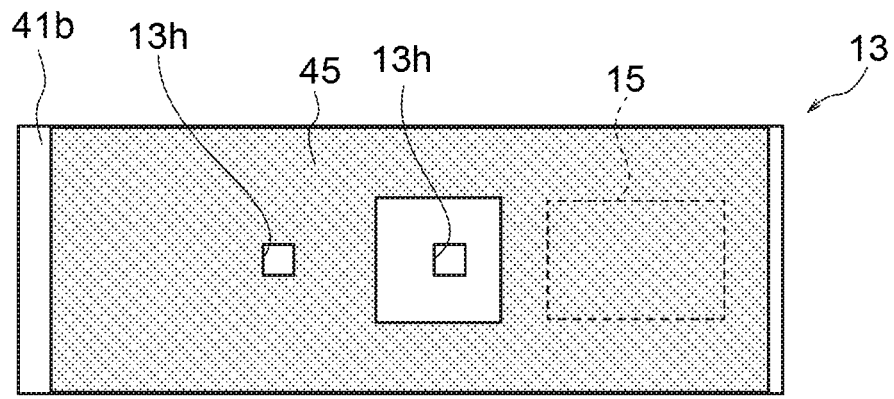

FIG. 9A to FIG. 9C are views showing an example of the flexible board 13 having the reference potential layer. FIG. 9A is a cross-sectional view of a part of the flexible board 13 and corresponds to the IXa-IXa line in FIG. 9B. FIG. 9B is a plan view of a part of the flexible board 13 on the side where the electronic component 15 is mounted (upper part on the drawing sheet in FIG. 9A). FIG. 9C is a plan view on the side opposite to FIG. 9B (lower part on the drawing sheet in FIG. 9A).

Note that, FIG. 9A shows the thickness of the flexible board 13 with a larger ratio relative to the dimensions in the planar direction than the actual ratio. In FIG. 9C, the contours of the electronic component 15 when viewed through the flexible board 13 are indicated by dotted lines.

In FIG. 9A to FIG. 9C, the flexible board is shown using notations of the first embodiment. However, the configuration in the present embodiment may be applied to the other embodiments as well. Further, in FIG. 9A to FIG. 9C, among the plurality of terminals 7, the terminal 7 given the reference potential is shown by the notation 7G, and the other terminals 7 are shown by the notation 7A. Note that, when the two need not particularly be differentiated, they will be referred to without attaching "A" or "G" in the same way as that hitherto.

As the electronic component 15, for easier illustration, an electronic component 15 having two terminals will be shown as an example. The electronic component 15 is for example a chip type component having a pair of pad-shaped terminals 15a. Note that, as will be understood from the explanation hitherto, the configuration of the electronic component 15 is not limited to such a configuration. The component may have three or more terminals or may have lead-shaped terminals.

The flexible board 13 is for example a double-sided board. That is, the flexible board 13 has an insulating and film-shaped base material 41, a first conductive layer 43 which is superposed on one surface of that (first surface 41a), and a second conductive layer 45 superposed on the other surface (second surface 41b). Note that, although not particularly shown, as already explained, the first conductive layer 43 and second conductive layer 45 may be suitably covered by a solder resist etc.

The first conductive layer 43 includes a plurality of (here, two) first conductor patterns 43a on which the electronic component 15 is mounted. Although notation is not particularly attached, each first conductor pattern 43a for example includes a pad-shaped land on which the electronic component 15 is mounted and a wiring extending from the land. Note that, in the example shown, the land and wiring are shown by rectangles extending with the constant widths, and a boundary of the two is indistinct.

The land of the first conductor pattern 43a and the terminal 15a of the electronic component 15 are bonded by a bump-shaped conductive bonding material 47 (for example solder). Due to this, the electronic component 15 is mounted on the flexible board 13. Further, the wiring of the first conductor pattern 43a is connected with the terminal 7A or other electronic component. The other electronic component may be for example one mounted on the flexible board 13 or may be one mounted on the assembly 11.

Note that, in the example shown, between the two first conductor patterns 43a, the first conductor pattern 43a on the left side on the drawing sheet is connected to the terminal 7A. More specifically, in the flexible board 13, a hole 13h is formed at the position of the wiring of the first conductor pattern 43a, the terminal 7A is inserted into the hole 13h, and the terminal 7A and the wiring are joined by a not shown bonding material. Further, the wiring of the first conductor pattern 43a on the right side on the drawing sheet extends to the outer side of the shown region (upper part on the drawing sheet in FIG. 7B) and is connected with the other electronic component.

The first conductive layer 43 may include a second conductor pattern 43b connected to the terminal 7G given the reference potential as well. The second conductor pattern 43b is connected to the terminal 7G in the same way as the first conductor pattern 43a described above. Note that, in the example shown, the second conductor pattern 43b is not connected to the electronic component. However, in the same way as the first conductor pattern 43a, it may include a wiring etc. and be connected to the electronic component as well.

The second conductive layer 45, for example, extends in a solid pattern state over substantially the entire surface (for example 80% or more) of the flexible board 13. Accordingly, for example, the second conductive layer 45, in a plane perspective when laying out the flexible board 13, includes a part which extends from the periphery of the terminal 7 up to the region overlapping the electronic component 15. Further, for example, the second conductive layer 45, in the plane perspective, includes a part overlapping the entirety of the electronic component 15.

The second conductive layer 45 is connected to the terminal 7G given the reference potential. The connection configuration thereof is the same as the connection configuration of the first conductive layer 43 and the terminal 7. Accordingly, the second conductive layer 45 extends up to the vicinity of the edge part of the hole 13*h* through which the terminal 7G is inserted. On the other hand, the second conductive layer 45 is separated from the hole 13*h* through which the terminal 7A is inserted.

In the case where the second conductive layer 45 given the reference potential is provided on the flexible board 13 as explained above, for example, noise from the outside part can be shut off. Further, for example, when applying the present embodiment to the third embodiment (FIG. 4A and FIG. 4B), in the second conductive layer 45, the parts positioned in the rear surface facing part 313*c* and plurality of side surface facing parts 313*f* function like a shield case, therefore the noise blocking effect is improved. Due to shutoff of noise, for example, the image quality is improved.

In the above embodiments, the extending parts 213*d*, 313*d*, and 413*d* and the branched parts 613*g* and 713*g* are single examples of the extending part having the bent part. The flexible boards 13, 213, 313, 413, 513, 613, and 713 are single examples of the flexible connection member extending from the assembly up to the terminals.

In the flexible board, the rear surface facing part which faces the inner surface of the rear surface part in the housing and in which the electronic component is mounted may be for example the terminal connection part as in the first embodiment, may be the extending part extending out of the terminal connection part as in the fourth embodiment, or may be the branched part which is branched from the relay part (part extending from the terminal connection part up to the assembly) as in the fifth or sixth embodiment.

Further, in the flexible board, the side surface facing part which faces the inner surface of the side surface part in the housing and at which the electronic component is mounted may be for example the extending part (overlapping region in that) extending out of the terminal connection part as in the second or third embodiment or may be the branched part which is branched from the relay part with respect to the terminal connection part as in the seventh embodiment.

The art according to the present disclosure is not limited to the embodiments explained above and may be worked in various ways.

The first to seventh embodiments may be suitably combined. For example, both of the extending part extending out of the terminal connection part (second to fourth embodiments, FIG. 3 to FIG. 5) and the branched part branched from the relay part (fifth to seventh embodiments, FIG. 6 to FIG. 8) may be provided. The bent part bent two or more times in the direction of bending the surface of the flexible board (fourth embodiment, FIG. 5) may be applied to not only the extending part falling into the rear surface part, but also the extending part having the overlapping region (second and third embodiments, FIG. 3 and FIG. 4) and branched part (fifth to seventh embodiments, FIG. 6 to FIG. 8) or may be provided at not only the rear surface facing part, but also the side surface facing part. The bent part when viewed on a plane when laying out the flexible board (sixth embodiment, FIG. 7) may be applied to not only the branched part, but also the extending part (second to fourth embodiments, FIG. 3 to FIG. 5) and may be provided in not only the rear surface facing part, but also the side surface facing part. Both of the bent part bending the surface of the flexible board (second to fourth and seventh embodiments, FIG. 3 to FIG. 5 and FIG. 8) and the bent part when viewed on a plane (sixth embodiment, FIG. 7) may be provided in the extending part, branched part, rear surface facing part, or side surface facing part.

From the viewpoint of positioning the electronic component separated from the assembly toward the rear surface part side (terminal side) (the viewpoint of not mounting the electronic component at the assembly), mounting of the electronic component on a flexible board extending from the assembly to the terminal is not an indispensable requirement. For example, separately from the flexible board (or another flexible member) extending from the assembly to the terminal, a rigid board on which the electronic component is mounted may be provided on the inner surface of the rear surface part, or an electronic component connected to the assembly by an electrical wire may be directly fixed to the inner surface of the rear surface part.

When the electronic component is mounted on a flexible board, the mounting position of the electronic component is not limited to the terminal connection part, extending part, or branched part. For example, it may be the relay part as well. Note that, naturally the electronic components may be mounted at two or more portions of these. Further, the electronic component mounted on the flexible board may be positioned in the vicinity of the assembly as well. Even in this case, compared with the case where the electronic component is mounted on the rigid board in the assembly, for example, heat transferred from the electronic component through the conductor to the image sensor is reduced or transmission noise between the electronic component on the flexible board and the electronic component in the assembly is reduced.

The planar shapes or three-dimensional shapes of the parts on the flexible board are not limited to the ones illustrated in the embodiments. For example, the relay part extending from the terminal to the assembly may be shaped bent in an L-shape when laid out to a planar shape as well. Further, for example, the extending part extending from the terminal connection part and the branched part branched from the relay part may be given a three-dimensional shape which cannot be said to face the rear surface part and cannot be said to face the side surface part.

The assembly is not limited to one configured by mounting the electronic component on one rigid board. For example, the assembly may be configured by stacking two or more rigid boards in the direction of the optical axis as well. In this case, for example, the image sensor may be mounted on the rigid board closest to the lens side, and the flexible board extending from the terminal may be connected to the rigid board positioned closest to the terminal side.

The connector for connection with the outside part of the camera module is not limited to a connector by which terminals are directly fixed to the flexible board and housing like the embodiments. For example, the connector may be one having a connector housing and a plurality of terminals which are held in the connector housing, mounted on the flexible board, and exposed from the housing of the camera module. In such a case, another metal member may be interposed between the terminal and the flexible board as well. Note that, even if another metal member in the connector is interposed in this way, the flexible board may be grasped as extending from the assembly to the terminal and/or being connected to the terminal.

REFERENCE SIGNS LIST

1 . . . camera module, 3 . . . housing, 3a . . . front surface part, 3b . . . rear surface part, 3d . . . side surface part, 5 . . . lens, 7 . . . terminal, 9 . . . image sensor, 11 . . . assembly, 13 . . . flexible board, and 15 . . . electronic component.

The invention claimed is:

1. A camera module comprising:
a housing which comprises a front surface part, a rear surface part that is opposite to the front surface part, and a side surface part connecting the front surface part and the rear surface part,
a lens exposed from the front surface part,
an assembly which includes an image sensor, and is located between the front surface part and the rear surface part,
a terminal which is located at the rear surface part and is used for connection with an outside part,
a flexible board which extends from the assembly to the terminal, and
an electronic component mounted on the flexible board, wherein
the flexible board comprises
 a terminal connection part which faces an inner surface of the rear surface part, and is connected with the terminal,
 a relay part which extends from part of an outer edge of the terminal connection part to the assembly, and
 an extending part which extends from another part of the outer edge of the terminal connection part, and
the electronic component is mounted in the extending part.

2. The camera module according to claim 1, wherein:
the extending part comprises an overlapping region capable of overlapping an inner surface of the side surface part, and
the electronic component is mounted in the overlapping region.

3. The camera module according to claim 2, wherein:
the housing comprises a plurality of side surface parts connecting the front surface part and the rear surface part,
the flexible board comprises a plurality of extending parts, each extending part of a plurality of extending parts extending from the terminal connection part toward a corresponding side surface part of the plurality of side surface parts, and
any of a plurality of electronic components is mounted in the overlapping region in the each extending part of the plurality of extending parts.

4. The camera module according to claim 3, wherein a total of numbers of the relay part and the plurality of extending parts, and the number of the plurality of side surface parts are the same.

5. The camera module according to claim 1, wherein:
the flexible board comprises
 an insulating and film-shaped base material,
 a first conductive layer which is superposed on one major surface of the film-shaped base material and includes a conductor pattern on which the electronic component is mounted,
 a second conductor layer which is superposed on another major surface of the film-shaped base material and, in a plane perspective when laying out the flexible board, extends from a periphery of the terminal to a region overlapping the electronic component, the second conductor layer having a reference potential.

6. The camera module according to claim 1, wherein the electronic component configures at least one of a power supply part supplying power to the image sensor and a processing part processing a signal from the image sensor.

7. A camera module comprising:
a housing which comprises a front surface part, a rear surface part that is opposite to the front surface part, and a side surface part connecting the front surface part and the rear surface part,
a lens exposed from the front surface part,
an assembly which includes an image sensor, and is located between the front surface part and the rear surface part,
a terminal which is located at the rear surface part and is used for connection with an outside part,
a flexible board which extends from the assembly to the terminal, and
an electronic component mounted on the flexible board, wherein:
the flexible board comprises
 a terminal connection part which faces an inner surface of the rear surface part, and is connected to the terminal,
 a relay part which extends from the terminal connection part to the assembly, and
 a branched part which extends out of the relay part so as to be branched with respect to the terminal connection part, and
the electronic component is mounted on the branched part.

8. The camera module according to claim 7, wherein:
the flexible board comprises
 an insulating and film-shaped base material,
 a first conductive layer which is superposed on one major surface of the film-shaped base material and includes a conductor pattern on which the electronic component is mounted,
 a second conductor layer which is superposed on another major surface of the film-shaped base material and, in a plane perspective when laying out the flexible board, extends from a periphery of the terminal to a region overlapping the electronic component, the second conductor layer having a reference potential.

9. A camera module, comprising:
a housing which comprises a front surface part, a rear surface part that is opposite to the front surface part, and a side surface part connecting the front surface part and the rear surface part,
a lens exposed from the front surface part,
an assembly which includes an image sensor, and is located between the front surface part and the rear surface part,
a terminal which is located at the rear surface part and is used for connection with an outside part,
a flexible board which extends from the assembly to the terminal, and an electronic component mounted on the flexible board, wherein:

the flexible board comprises
- a terminal connection part which faces an inner surface of the rear surface part, and is connected to the terminal,
- a relay part which extends from part of an outer edge of the terminal connection part to the assembly, and
- an extending part which extends out of another part of the outer edge of the terminal connection part or extends out of the relay part so as to be branched from the terminal connection part, the electronic component is mounted on the extending part, and the extending part comprises at least one of a first bent part and a second bent part between a root of the extending part and the electronic component, wherein the first bent part is bent when viewed on a plane when laying out the flexible board, and the second bent part is bent in a direction of a bending of a surface of the flexible board.

10. The camera module according to claim 9, wherein the extending part comprises the second bent part, and the second bent part is alternately bent two or more times in the direction of the bending of the surface of the flexible board.

11. The camera module according to claim 9, wherein:

the flexible board comprises
- an insulating and film-shaped base material,
- a first conductive layer which is superposed on one major surface of the film-shaped base material and includes a conductor pattern on which the electronic component is mounted,
- a second conductor layer which is superposed on another major surface of the film-shaped base material and, in a plane perspective when laying out the flexible board, extends from a periphery of the terminal to a region overlapping the electronic component, the second conductor layer having a reference potential.

* * * * *